(12) United States Patent
Ota et al.

(10) Patent No.: US 9,196,473 B2
(45) Date of Patent: Nov. 24, 2015

(54) METHOD OF MANUFACTURING AN OXYNITRIDE FILM FOR A SEMICONDUCTOR DEVICE

(75) Inventors: Yosuke Ota, Oume (JP); Yoshiro Hirose, Toyama (JP); Naonori Akae, Toyama (JP); Yushin Takasawa, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 208 days.

(21) Appl. No.: 13/976,673

(22) PCT Filed: Dec. 16, 2011

(86) PCT No.: PCT/JP2011/079221
§ 371 (c)(1),
(2), (4) Date: Aug. 27, 2013

(87) PCT Pub. No.: WO2012/090738
PCT Pub. Date: Jul. 5, 2012

(65) Prior Publication Data
US 2013/0337660 A1 Dec. 19, 2013

(30) Foreign Application Priority Data

Dec. 27, 2010 (JP) ................. 2010-289358

(51) Int. Cl.
| | |
|---|---|
| *C23C 16/30* | (2006.01) |
| *C23C 16/34* | (2006.01) |
| *C23C 16/40* | (2006.01) |
| *H01L 21/02* | (2006.01) |
| *C23C 16/455* | (2006.01) |

(52) U.S. Cl.
CPC .......... *H01L 21/0214* (2013.01); *C23C 16/308* (2013.01); *C23C 16/45527* (2013.01); *C23C16/45531* (2013.01); *C23C 16/45563* (2013.01); *H01L 21/0217* (2013.01); *H01L 21/0228* (2013.01); *H01L 21/02211* (2013.01)

(58) Field of Classification Search
CPC ........ C23C 16/308; C23C 16/34; C23C 16/40
See application file for complete search history.

(56) References Cited

U.S. PATENT DOCUMENTS 6,013,553 A * 1/2000 Wallace et al. ............... 438/287
8,609,551 B2 * 12/2013 Akae et al. ................... 438/778
(Continued)

FOREIGN PATENT DOCUMENTS

| JP | 2004-006551 A | 1/2004 |
|---|---|---|
| JP | A-2009-206489 | 9/2009 |

(Continued)

OTHER PUBLICATIONS

Raider, S.I., et al., "Surface Oxidation of Silicon Nitride Films". J. Electrochem. Soc. 1976, vol. 123, Issue 4, 560-565.*

(Continued)

*Primary Examiner* — Bret Chen
(74) *Attorney, Agent, or Firm* — Oliff PLC

(57) ABSTRACT

A method that includes: forming a specific element-containing layer by supplying a source gas to the substrate heated in a processing vessel, under a condition that a thermal decomposition reaction of the source gas is caused; changing the specific element-containing layer to a nitride layer by supplying a nitrogen-containing gas to the substrate; and changing the nitride layer to an oxynitride layer by supplying an oxygen-containing gas to the substrate, the source gas is sprayed in parallel to a surface of the substrate more strongly than a case of spraying the inert gas in parallel to the surface of the substrate in purging the inside of the processing vessel, by supplying an inert gas or a hydrogen-containing gas through the nozzle.

19 Claims, 14 Drawing Sheets

(56) References Cited

U.S. PATENT DOCUMENTS

| | | | |
|---|---|---|---|
| 2004/0144980 A1* | 7/2004 | Ahn et al. | 257/69 |
| 2004/0266217 A1* | 12/2004 | Kim et al. | 438/778 |
| 2005/0118837 A1* | 6/2005 | Todd et al. | 438/791 |
| 2005/0153571 A1* | 7/2005 | Senzaki | 438/778 |
| 2006/0063346 A1* | 3/2006 | Lee et al. | 438/393 |
| 2009/0170345 A1* | 7/2009 | Akae et al. | 438/786 |
| 2009/0197424 A1 | 8/2009 | Sakai et al. | |

FOREIGN PATENT DOCUMENTS

| | | |
|---|---|---|
| JP | A-2010-10497 | 1/2010 |
| JP | A-2010-50425 | 3/2010 |
| JP | A-2010-0268007 | 11/2010 |
| JP | A-2010-283357 | 12/2010 |

OTHER PUBLICATIONS

Kennedy, G.P., et al., "Oxidation of silicon nitride films in an oxygen plasma". Journal of Applied Physics, vol. 85, No. 6, Mar. 15, 1999, pp. 3319-3326.*

Fang, Te-Hua, et al., "Local oxidation characteristics on titanium nitride film by electrochemical nanolithography with carbon nanotube tip." Electrochemistry Communications 8 (2006) 173-178.*

International Search Report issued in International Patent Application No. PCT/JP2011/079221 dated Feb. 28, 2012.

International Preliminary Report on Patentability issued in International Patent Application No. PCT/JP2011/079221 dated Jul. 2, 2013.

Sep. 24, 2014 Office Action issued in Korean Application No. 10-2013-7010526.

* cited by examiner (a) WHEN FLOW VELOCITY OF HCD IS SMALL (b) WHEN FLOW VELOCITY OF HCD IS LARGE

METHOD OF MANUFACTURING AN OXYNITRIDE FILM FOR A SEMICONDUCTOR DEVICE

TECHNICAL FIELD

The present invention relates to a method of manufacturing a semiconductor device and a method of processing a substrate including a step of forming a thin film on a substrate, and a substrate processing apparatus suitably used in the step.

DESCRIPTION OF RELATED ART

A flush memory includes an electronic storage region (floating gate) surrounded by an insulating film, and has an operation principle in which information is written by exchange of electrons through a thin tunnel oxide film, and the electrons are held and stored for a long time by utilizing insulation properties of the thin oxide film. In the flash memory, the electrons or holes (positive holes) are passed through the tunnel insulating film and accumulated in the floating gate, during write and erase of the information, to thereby store the information. However, as a miniaturization is in progress, a thinner Equivalent Oxide Thickness (EOT) in the tunnel insulating film is requested. Therefore, it can be considered that a nitride film ($Si_3N_4$ film, simply called a SiN film hereafter) having a higher dielectric constant than that of the oxide film ($SiO_2$ film, simply called a SiO film hereafter) is used as the tunnel insulating film. However, the SiN film has a high defect density, and a reduction thereof is requested. As the defect, a structural defect known as the defect, a dangling bond is known, wherein the dangling bond is easily bonded to hydrogen, and therefore a film containing many hydrogen atoms therein, can be estimated to be a film with high defect density. Accordingly, the SiN film with high quality not containing hydrogen, is requested.

Conventionally, the SiN film is formed in a temperature zone in the vicinity of 700° C. to 800° C. for example, by a CVD (Chemical Vapor Deposition) method using a $SiH_2Cl_2$ gas and a $NH_3$ gas. However, the SiN film (CVD-SiN film) formed by the CVD method has a high defect density, and contains hydrogen of $10^{21}$-order at a quantitative value measured by a thermal desorption method (TDS), and such a state is desired to be improved.

Further, in the CVD method, it is difficult to reduce the hydrogen by setting a film formation temperature to be high, under restriction of film thickness uniformity and step coverage properties. Therefore, a film formation technique replacing the CVD method is desired.

In the ALD (Atomic Layer Deposition) method given as the technique replacing the CVD method, for example used for ALD-SiN film formation using $SiH_2Cl_2$ gas and the $NH_3$ gas, hydrogen is contained in a source material, and the hydrogen derived from the source material remains in the film in the temperature zone (up to about 550° C.) in which the ALD method can be used. Therefore, the technique of realizing good step coverage and uniformity in the film thickness is desired, instead of the ALD-SiN film formation using the $SiH_2Cl_2$ gas and the $NH_3$ gas.

SUMMARY OF THE INVENTION

Problem to be Solved by the Invention

As a result of strenuous efforts by inventors of the present invention, there is provided a method of forming a nitride film with good uniformity in the film thickness, having extremely low hydrogen concentration in the film in a high temperature zone.

However, when the nitride film formed by this method is used as a tunnel insulating film of a flash memory or a gate insulating film of a MOS capacitor, properties of the nitride film are changed, due to application of a stress voltage (a writing voltage of the flash memory or a gate voltage of the MOS capacitor, etc.) to the nitride film, thus affecting an operation of a device in some cases. For example, when the above-mentioned nitride film is used as the gate insulating film of the MOS capacitor, a flat band voltage is shifted and a threshold voltage is fluctuated in some cases, by application of the gate voltage, etc., to the nitride film.

An object of the present invention is to provide a method of manufacturing a semiconductor device, a method of processing a substrate, and a substrate processing apparatus, capable of forming an insulating film with high resistance to a stress voltage, with extremely low hydrogen concentration in a film, and good uniformity in a film thickness, in a high temperature zone.

Means for Solving the Problem

According to an aspect of the present invention, there is provided a method of manufacturing a semiconductor device, including:

forming an oxynitride film having a specific film thickness on a substrate by alternately repeating:

forming a specific element-containing layer on the substrate by supplying a source gas containing a specific element to the substrate heated in a processing vessel, under a condition that a thermal decomposition reaction of the source gas is caused;

changing the specific element-containing layer to a nitride layer by supplying a nitrogen-containing gas to the substrate heated in the processing vessel under a pressure of less than atmospheric pressure;

changing the nitride layer to an oxynitride layer by supplying an oxygen-containing gas to the substrate heated in the processing vessel under a pressure of less than atmospheric pressure, interposing into the above sequences, purging of an inside of the processing vessel by supplying an inert gas into the processing vessel, wherein in forming the specific element-containing layer, the source gas is supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by supplying an inert gas or a hydrogen-containing gas to the substrate through the nozzle together with the source gas.

According to other aspect of the present invention, there is provided a method of processing a substrate, including:

forming an oxynitride film having a specific film thickness on a substrate by alternately repeating:

forming a specific element-containing layer on the substrate by supplying a source gas containing a specific element to the substrate heated in a processing vessel, under a condition that a thermal decomposition reaction of the source gas is caused;

changing the specific element-containing layer to a nitride layer by supplying a nitrogen-containing gas to the substrate heated in the processing vessel under a pressure of less than atmospheric pressure; and changing the nitride layer to an oxynitride layer by supplying an oxygen-containing gas to the substrate heated in the processing vessel under a pressure of less than atmospheric pressure;

interposing into the above sequences, purging of an inside of the processing vessel by supplying an inert gas into the processing vessel, wherein in forming the specific element-containing layer, the source gas is supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by supplying an inert gas or a hydrogen-containing gas to the substrate through the nozzle together with the source gas.

According to further other aspect of the present invention, there is provided a substrate processing apparatus, including:

a processing vessel configured to house a substrate;

a heater configured to heat the substrate in the processing vessel;

a source gas supply system configured to supply a source gas containing a specific element into the processing vessel;

a nitrogen-containing gas supply system configured to supply a nitrogen-containing gas into the processing vessel;

an oxygen-containing gas supply system configured to supply an oxygen-containing gas into the processing vessel;

an inert gas or a hydrogen-containing gas supply system configured to supply an inert gas or a hydrogen-containing gas into the processing vessel;

a pressure adjustment part configured to adjust a pressure in the processing vessel; and a control part configured to control the heater, the source gas supply system, the nitrogen-containing gas supply system, the oxygen-containing gas supply system, the inert gas or hydrogen-containing gas supply system and the pressure adjustment part, so that processing of forming an oxynitride film having a specific film thickness on the substrate is performed by alternately repeating:

processing of forming a specific element-containing layer on the substrate by supplying the source gas to the substrate heated in the processing vessel, under a condition that a thermal decomposition reaction of the source gas is caused;

processing of changing the specific element-containing layer to a nitride layer by supplying the nitrogen-containing gas to the substrate heated in the processing vessel under a pressure of less than atmospheric pressure; and processing of changing the nitride layer to an oxynitride layer by supplying the oxygen-containing gas to the substrate heated in the processing vessel under a pressure of less than atmospheric pressure, processing of interposing into the above sequences, purging of an inside of the processing vessel by supplying the inert gas into the processing vessel, wherein in forming the specific element-containing layer, the source gas is supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by supplying an inert gas or a hydrogen-containing gas to the substrate through the nozzle together with the source gas.

Advantage of the Invention

According to the present invention, there is provided a method of manufacturing a semiconductor device, a method of processing a substrate and a substrate processing apparatus, capable of forming an insulating film with high resistance to a stress voltage, with extremely low hydrogen concentration in a film, and good uniformity in a film thickness, in a high temperature zone.

MODE FOR CARRYING OUT THE INVENTION

Figure 1:
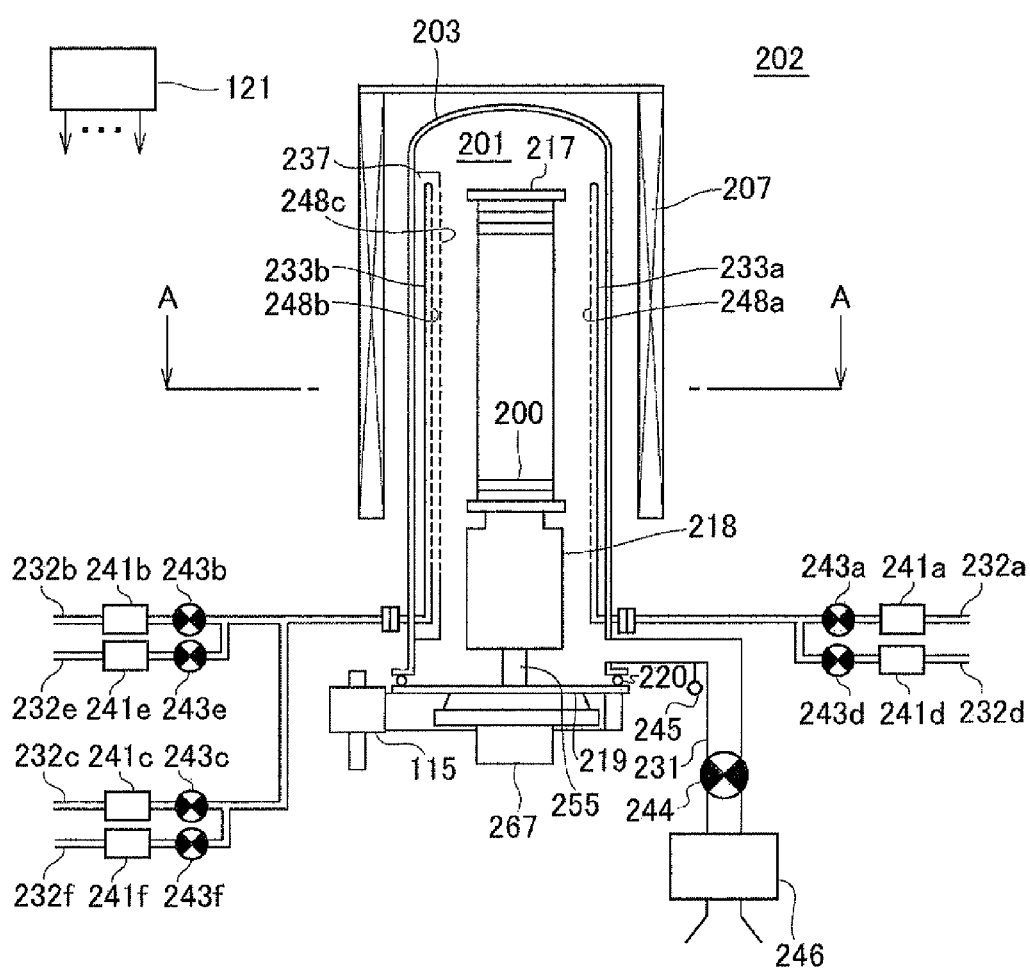
FIG. 1 is a schematic block diagram of a vertical processing furnace of a substrate processing apparatus suitably used in this embodiment, and is a view showing the processing furnace portion by a vertical sectional view.

As a result of strenuous efforts by inventors of the present invention regarding a reason why properties of a nitride film are changed by applying a stress voltage to the nitride film, thus adversely affecting an operation of a device, it is found that a defect that exists in the nitride film is one of the factors of the above-mentioned phenomenon. Although the nitride film formed by the above-mentioned method has an excellent property of an extremely low hydrogen concentration and stress in a film, it has a specific level of stress, and a defect due to a stain generated by the stress exists in the film in some cases. Further, the defect due to loss of nitrogen also exists in the nitride film. A trap site (trap level) for capturing an electric charge supplied into the film, is formed by these defects. Therefore, when the above-mentioned nitride film is used as a gate insulating film of a MOS capacitor for example, the electric charge is supplied into the nitride film by applying a stress voltage such as a gate voltage, etc., to the nitride film, and the electric charge supplied into the film is captured by the trap site. Then, when positive or negative electric charge exists in the electric charge captured by the trap site, a flat band voltage of the MOS capacitor is shifted (a shift point from a depletion layer to an accumulating layer is changed), thus fluctuating a threshold voltage in some cases.

As a result of strenuous efforts by the inventors of the present invention, it is found that such a problem can be solved by introducing oxygen (O) atoms into the nitride film to thereby change the nitride film to an oxynitride film. Namely, an oxynitride film having a specific film thickness is formed on a substrate by alternately repeating: forming a specific element-containing layer on the substrate by supplying a source gas containing a specific element to the substrate heated in a processing vessel, under a condition that a thermal decomposition reaction of the source gas is caused; changing the specific element-containing layer to a nitride layer by supplying a nitrogen-containing gas to the substrate heated in the processing vessel under a pressure of less than atmospheric pressure; and changing the nitride layer to an oxynitride layer by supplying an oxygen-containing gas to the substrate heated in the processing vessel under a pressure of less than atmospheric pressure, interposing into the above sequences, purging of an inside of the processing vessel by supplying an inert gas into the processing vessel. In this case, in forming the specific element-containing layer, the source gas is supplied to the substrate through a nozzle provided at a lateral side of the substrate, and at this time, by supplying the inert gas or a hydrogen-containing gas to the substrate through the nozzle together with the source gas, a flow velocity of the source gas that flows in parallel to a surface of the substrate, can be made larger than the flow velocity of the inert gas that flows in parallel to the surface of the substrate in purging the inside of the processing vessel. Thus, an insulating film with extremely low hydrogen concentration in a film, good uniformity in a film thickness, and high resistance to the stress voltage in a high temperature zone, can be formed.

By changing the nitride layer to the oxynitride layer, the defect in the oxynitride film can be further reduced while utilizing an excellent characteristic that there are few defects in the nitride layer before being changed to the oxynitride layer. As a result, the oxynitride film with high resistance to the stress voltage can be formed. When the formed oxynitride film is used as the gate insulating film of the MOS capacitor for example, capture of the electric charge in the gate insulating film can be more effectively suppressed, and shift, etc., of the flat band voltage can be more surely avoided.

Forming the specific element-containing layer on the substrate, is performed under a condition that a CVD reaction is caused. At this time, a specific element layer is formed on the substrate as the specific element-containing layer of less than one atomic layer to about several atomic layers. The specific element-containing layer may be an adsorption layer of the source gas containing the specific element (also simply called a source gas hereafter). Here, the specific element layer is a general term including a continuous layer and a discontinuous layer made of the specific element and a thin film composed of an overlap of these layers. The continuous layer made of the specific element is also called the thin film.

Further, the adsorption layer of the source gas includes a continuous chemical adsorption layer of gas molecules of the source gas, and a discontinuous chemical adsorption layer. The layer of less than one atomic layer means the atomic layer formed discontinuously. The specific element layer is formed by depositing the specific element on the substrate, under a condition that the source gas is self-decomposed (thermally decomposed), namely under a condition that the thermal decomposition reaction of the source gas is caused. The adsorption layer of the source gas is formed by adsorption of the source gas on the substrate, under a condition that the source gas is not self-decomposed (thermally decomposed), namely, under the condition that the thermal decomposition reaction of the source gas is not caused. A film formation rate can be made higher in a case of forming the specific element layer, than a case of forming the adsorption layer of the source gas on the substrate, and this is preferable.

Further, in changing the specific element-containing layer to the nitride layer, the nitrogen-containing gas is thermally activated or thermally decomposed in the processing vessel under a pressure of less than atmospheric pressure, to thereby generate nitriding species containing nitrogen, and by the nitriding species, the specific element-containing layer is nitrided and changed (modified) to the nitride layer. Namely, the nitriding species and the specific element-containing layer are reacted with each other, to thereby change the specific element-containing layer to the nitride layer. Changing the specific element-containing layer to the nitride layer can be performed under a depressurized atmosphere by non-plasma. In changing the specific element-containing layer to the nitride layer, the nitrogen-containing gas can also be used by being activated by plasma.

Further, in changing the nitride layer to the oxynitride layer, the oxygen-containing gas is thermally activated or thermally decomposed in the processing vessel under a pressurized atmosphere of less than atmospheric pressure to thereby generate oxidizing species containing oxygen, and by the oxidizing species, the nitride layer is oxidized and changed (modified) to the oxynitride layer. Namely, the oxidizing species and the nitride layer are reacted with each other, to thereby change the nitride layer to the oxynitride layer. Changing of the nitride layer to the oxynitride layer can be performed under the depressurized atmosphere by non-plasma. In changing the nitride layer to the oxynitride layer, the oxygen-containing gas can be used by being activated by plasma.

Then, in forming the specific element-containing layer, the source gas is supplied to the substrate through the nozzle provided at the lateral side of the substrate, and at this time, the inert gas or the hydrogen-containing gas is supplied through the same nozzle together with the source gas, to thereby make the flow velocity of the source gas that flows in parallel to the surface of the substrate, larger than the flow velocity of the inert gas that flows in parallel to the surface of the substrate in purging. Namely, the source gas is sprayed in parallel to the surface of the substrate, more strongly than a case of spraying the inert gas in parallel to the surface of the substrate in purging the inside of the processing vessel. Thus, by increasing the flow velocity of the source gas that flows in parallel to the surface of the substrate, the specific element-containing layer can be formed while inhibiting (suppressing) the deposition or adsorption of the specific element-containing layer onto the substrate, and a deposition or adsorption center of the specific element-containing layer can be moved so as to be close to a center from an edge side of the substrate. As a result, the oxynitride film with good uniformity of the film thickness can be formed in the high temperature zone.

The present invention is provided based on a knowledge obtained by the inventors of the present invention. An embodiment of the present invention will be described hereafter, with reference to the drawings.

(1) Structure of the Substrate Processing Apparatus

Figure 2:
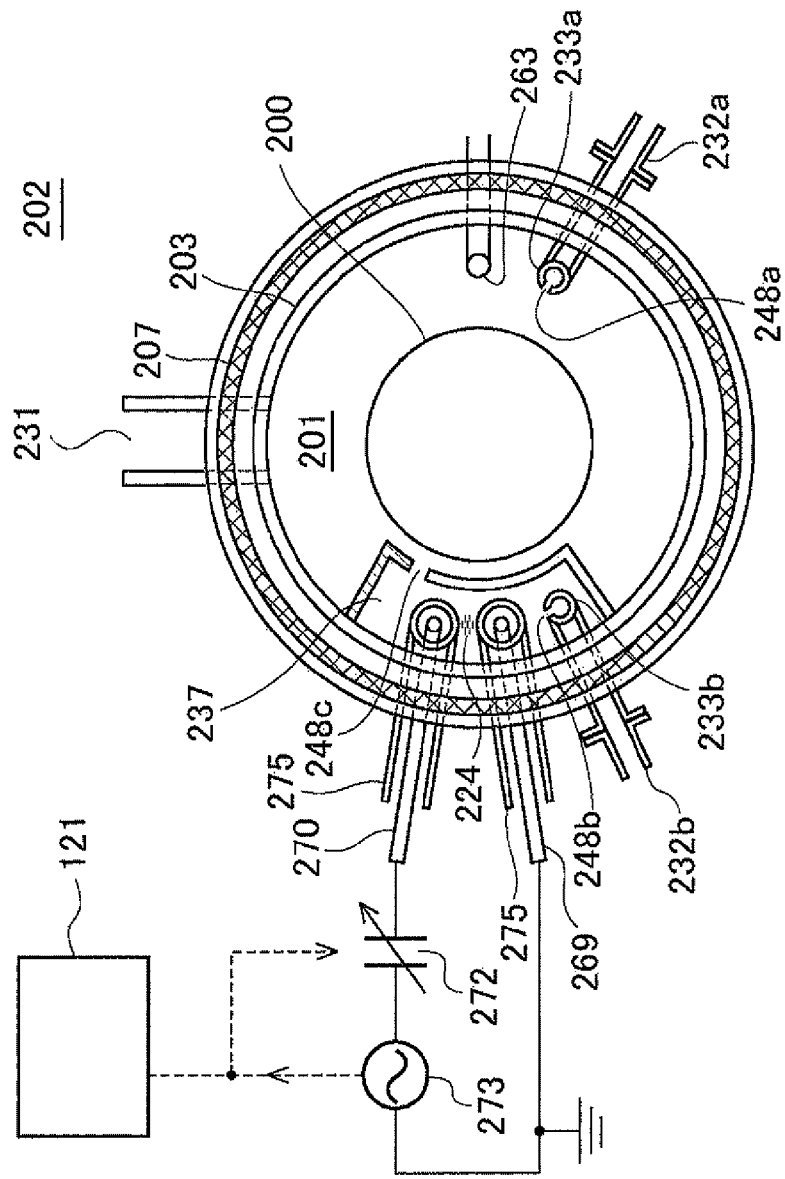
FIG. 2 is a schematic block diagram of the vertical processing furnace of the substrate processing apparatus suitably used in this embodiment, and is a view showing the processing furnace portion taken along the line A-A of FIG. 1.

FIG. 1 is a schematic block diagram of a vertical processing furnace of the substrate processing apparatus suitably used in this embodiment, and shows a processing furnace 202 portion in a vertical section. Further, FIG. 2 is a schematic block diagram of a vertical processing furnace suitably used in this embodiment, and shows the processing furnace 202 portion taken along the line A-A of FIG. 1. The present invention is not limited to the substrate processing apparatus of this embodiment, and can be suitably applied to a substrate processing apparatus having a single wafer type, Hot Wall type, or Cold Wall type processing furnace.

As shown in FIG. 1, the processing furnace 202 includes a heater 207 as a heating unit (heating mechanism). The heater 207 has a cylindrical shape, and is vertically installed on a heater base (not shown) as a holding plate by being supported by the heater base. The heater 207 functions as an activation mechanism of thermally activating a gas as described later.

A reaction tube 203 constituting the reaction vessel (processing vessel) is disposed inside of the heater 207 concentrically with the heater 207. The reaction tube 203 is made of a heat-resistant material such as quartz ($SiO_2$) or silicon carbide (SiC), etc., for example, and is formed into a cylindrical shape with an upper end closed and a lower end opened. A processing chamber 201 is formed in cylinder hollow part of the process tube 203, and is configured to house the wafer 200 being the substrate in a horizontal posture by a boat 217 described later, so as to be vertically arranged in multiple stages.

A first nozzle 233a being a first gas introduction part, and a second nozzle 233b being a second gas introduction part, are provided so as to pass through a lower side wall of the reaction tube 203. A first gas supply tube 232a is connected to the first nozzle 233a. Further, a second gas supply tube 232b and a third gas supply tube 232c are connected to the second nozzle 233b. Thus, two nozzles 233a, 233b and three gas supply tubes 232a, 232b, 232c are provided on the reaction tube 203, so that a plurality of kinds of gases, three gases here, can be supplied into the processing chamber 201.

It is also acceptable that a metal manifold for supporting the reaction tube 203 is provided in a lower part of the reaction tube 203, and each nozzle is provided so as to pass through a side wall of the metal manifold. In this case, an exhaust tube 231 described later may further be provided on the metal manifold. In this case as well, the exhaust tube 231 may be provided not on the metal manifold but in the lower part of the reaction tube 203. Thus, a furnace throat portion of the processing furnace is made of metal, and the nozzle, etc., may be attached to the metal furnace throat portion.

A mass flow controller (MFC) 241a being a flow rate control unit (flow rate control part), and a valve 243a being an open/close valve, are provided on the first gas supply tube 232a sequentially from an upstream direction. Further, a first inert gas supply tube 232d is connected to a downstream side of the valve 243a of the first gas supply tube 232a. A mass flow controller 241d being the flow rate control unit (flow rate control part), and a valve 243d being the open/close valve, are provided on the first inert gas supply tube 232d sequentially from the upstream direction. Further, the above-mentioned first nozzle 233a is connected to a tip end of the first gas supply tube 232a. The first nozzle 233a is provided in an arc-shaped space between the inner wall of the reaction tube 203 and the wafers 200, extending from a lower part to an upper part of the inner wall of the reaction tube 203, so as to rise toward an upper part of a stacking direction of the wafers 200. Namely, the first nozzle 233a is provided in a region horizontally surrounding a wafer arrangement region in which the wafers 200 are arranged, at a lateral side of the wafer arrangement region, along the wafer arrangement region. The first nozzle 233a is formed as an L-shaped long nozzle, with its horizontal portion provided so as to pass through the lower side wall of the reaction tube 203, and its vertical portion provided so as to rise at least from one end side to the other end side of the wafer arrangement region. Gas supply holes 248a for supplying gas are formed on a side face of the first nozzle 233a. The gas supply holes 248a are opened to face a center of the reaction tube 203, so that the gas can be supplied toward the wafers 200. A plurality of gas supply holes 248a are provided extending from the lower part to the upper part, each of them provided having the same opening area at the same opening pitch.

A first gas supply system is mainly constituted of the first gas supply tube 232a, the mass flow controller 241a, and the valve 243a. The first nozzle 233a may be included in the first gas supply system. Further, a first inert gas supply system is mainly constituted of the first inert gas supply tube 232d, the mass flow controller 241d, and the valve 243d. The first inert gas supply system also functions as a purge gas supply system.

A mass flow controller (MFC) 241b being the flow rate control unit (flow rate control part), and a valve 243b being the open/close valve, are provided on the second gas supply tube 232b, sequentially from the upstream direction. Further, a second inert gas supply tube 232e is connected to the downstream side of the valve 243b of the second gas supply tube 232b. A mass flow controller 241e being the flow rate control unit (flow rate control part), and a valve 243e being the open/close valve, are provided on the second inert gas supply tube 232e sequentially from the upstream direction. Moreover, the above-mentioned second nozzle 233b is connected to the tip end of the second gas supply tube 232b. The second nozzle 233b is provided in a buffer chamber 237 being a gas dispersion space.

The buffer chamber 237 is provided in the arc-shaped space between the inner wall of the reaction tube 203 and the wafers 200, in a portion extending from the lower part to the upper part of the inner wall of the reaction tube 203, along the stacking direction of the wafers 200. Namely, the buffer chamber 237 is provided in the region horizontally surrounding the wafer arrangement region, at the lateral side of the wafer arrangement region, along the wafer arrangement region. Gas supply holes 248c for supplying gas are provided on an end portion of a wall adjacent to the wafers 200 in the buffer chamber 237. The gas supply holes 248c are opened to face the center of the reaction tube 203, so that the gas can be supplied to the wafers 200. A plurality of gas supply holes 248c are provided extending from the lower part to the upper part of the reaction tube 203, each of them provided having the same opening area, at the same opening pitch.

The second nozzle 233b is provided at an opposite side end portion to the end portion where the gas supply holes 248c of the buffer chamber 237 are provided, extending from the lower part to the upper part of the inner wall of the reaction tube 203, so as to rise toward the upper part of the stacking direction of the wafers 200. Namely, the second nozzle 233b is provided in the region horizontally surrounding the wafer arrangement region at the lateral side of the wafer arrangement region, along the wafer arrangement region. The second nozzle 233b is formed as the L-shaped long nozzle, with its horizontal portion provided so as to pass through the lower side wall of the reaction tube 203, and its vertical portion provided so as to rise at least from one end side to the other end side of the wafer arrangement region. Gas supply holes 248b for supplying gas are provide on the side face of the second nozzle 233b. The gas supply holes 248b are opened to face the center of the buffer chamber 237. Similarly to the gas supply holes 248c of the buffer chamber 237, a plurality of gas supply holes 248b are provided extending from the lower part to the upper part of the reaction tube 203. Each opening area of the plurality of gas supply holes 248b may be the same opening area at the same opening pitch from the upstream side (lower part) to the downstream side (upper part) when a differential pressure is small between inside of the buffer chamber 237 and inside of the processing chamber 201. However, when the differential pressure is large, the opening area may be set to be large or the opening pitch may be set to be small from the upstream side to the downstream side.

In this embodiment, by adjusting the opening area and the opening pitch of each of the gas supply holes 248b of the second nozzle 233b from the upstream side to the downstream side as described above, gases of approximately the same flow rate are sprayed from each of the gas supply holes 248b, although there is a difference in the flow velocity. Then, the gas sprayed from each of the gas supply holes 248b is introduced into the buffer chamber 237 once, and the difference in the flow velocity of the gas is equalized in the buffer chamber 237. Namely, the gas sprayed into the buffer chamber 237 from each of the gas supply holes 248b of the second nozzle 233b, is sprayed into the processing chamber 201 from the gas supply holes 248c of the buffer chamber 237, after a particle speed of each gas is relaxed in the buffer chamber 237. Thus, the gas sprayed into the buffer chamber 237 from each gas supply hole 248b of the second nozzle 233b, becomes the gas having equalized flow rate and flow velocity when being sprayed into the processing chamber 201 from each gas supply hole 248c of the buffer chamber 237.

A second gas supply system is mainly constituted of the second gas supply tube 232b, the mass flow controller 241b, and the valve 243b. The second nozzle 233b and the buffer chamber 237 may be included in the second gas supply system. Further, a second inert gas supply system is mainly constituted of the second inert gas supply tube 232e, the mass flow controller 241e, and the valve 243e. The second inert gas supply system also functions as the purge gas supply system.

A mass flow controller (MFC) 241c being the flow rate control unit (flow rate control part), and a valve 243c being the open/close valve, are provided on the third gas supply tube 232c sequentially from the upstream direction. Further, a third inert gas supply tube 232f is connected to the downstream side of the valve 243c of the third gas supply tube 232c. A mass flow controller 241f being the flow rate control unit (flow rate control part, and a valve 243f being the open/close valve, are provided on the third inert gas supply tube 232f sequentially from the upstream direction. Further, the tip end of the third gas supply tube 232c is connected to the downstream side of the valve 243b of the second gas supply tube 232b.

A third gas supply system is mainly constituted of the third gas supply tube 232c, the mass flow controller 241e, and the valve 243c. The downstream side of a connection part connected to the third gas supply tube 232c of the second gas supply tube 232b, namely the second nozzle 233b and the buffer chamber 237 may be included in the third gas supply system. Further, a third inert gas supply system is mainly constituted of the third inert gas supply tube 232f, the mass flow controller 241f, and the valve 243f. The third inert gas supply system also functions as the purge gas supply system.

Thus, in the method of supplying gas of this embodiment, gas is transferred through the nozzles 233a, 233b and the buffer camber 237 disposed in an arc-shaped vertically long space partitioned by the inner wall of the reaction tube 203 and edge portions of a plurality of stacked wafers 200, and the gas is sprayed into the reaction tube 203 for the first time in the vicinity of the wafers 200, from the gas supply holes 248a opened on the nozzle 233a, and the gas supply holes 248c opened on the buffer chamber 237, so that the gas in the reaction tube 203 flows mainly in parallel to the surfaces of the wafers 200, namely in a horizontal direction. With this structure, there is an effect that the gas can be uniformly supplied to each wafer 200, and the film thickness of the thin film formed on each wafer 200 can be made uniform. A remained gas after reaction flows toward the exhaust port, namely the exhaust tube 231 described later. A flowing direction of this remained gas is specified suitably depending on a position of an exhaust port, and is not limited to a vertical direction.

As the source gas containing the specific element, namely the source gas containing silicon (Si) (silicon-containing gas) as the specific element, for example a hexachlorodisilane ($Si_2Cl_6$, abbreviated as HCD) gas is supplied into the processing chamber 201 from the first gas supply tube 232a through the mass flow controller 241a, the valve 243a, and the first nozzle 233a. Namely, the first gas supply system is configured as a source gas supply system (silicon-containing gas supply system). When a liquid source in a liquid state under normal temperature and pressure, is used like HCD, the liquid source is vaporized by a vaporization system such as a vaporizer or a bubbler, etc., which is then supplied as the source gas. Simultaneously at this time, the inert gas as the deposition/adsorption inhibiting gas is supplied from the first inert gas supply tube 232d, into the first gas supply tube 232a through the mass flow controller 241d and the valve 243d. Here, the deposition/adsorption inhibiting gas is the gas for inhibiting the deposition of silicon or the adsorption of the HCD gas on the surface of the wafer 200. The inert gas as the deposition/adsorption inhibiting gas supplied into the first gas supply tube 232a, is supplied into the processing chamber 201 together with the HCD gas through the first nozzle 233a. At this time, the hydrogen-containing gas may be supplied into the first gas supply tube 232a instead of the inert gas, as the deposition/adsorption inhibiting gas. In this case, the first inert gas supply system may be replaced with a hydrogen-containing gas supply system. Namely in this case, the hydrogen-containing gas supply system is constituted of the hydrogen-containing gas supply tube 232d, the mass flow controller 241d, and the valve 243d. Thus, the first inert gas supply system is also constituted as the deposition/adsorption inhibiting gas supply system, and can be replaced with the hydrogen-containing gas supply system.

As the gas containing nitrogen (nitrogen-containing gas), for example an ammonia ($NH_3$) gas is supplied into the processing chamber 201 from the second gas supply tube 232b through the mass flow controller 241b, the valve 243b, the second nozzle 233b, and the buffer chamber 237. Namely, the second gas supply system is constituted as a nitrogen-containing gas supply system. Simultaneously at this time, the inert gas may be supplied into the second gas supply tube 232b from the second inert gas supply tube 232e through the mass flow controller 241e and the valve 243e.

As the gas containing oxygen (oxygen-containing gas), for example a nitrous oxide ($N_2O$) gas is supplied into the processing chamber 201 from the third gas supply tube 232c through the mass flow controller 241c, the valve 243c, the second gas supply tube 232b, the second nozzle 233b, and the buffer chamber 237. Namely, the third gas supply system is constituted as an oxygen-containing gas supply system. Simultaneously at this time, the inert gas is supplied into the third gas supply tube 232c from the third inert gas supply tube 232f through the mass flow controller 241f and the valve 243f.

In this embodiment, the NH$_3$ gas and the N$_2$O gas are supplied into the processing chamber 201 (into the buffer chamber 237) through the same nozzle. However, each gas may be supplied into the processing chamber 201 through separate nozzles respectively. However, by sharing the nozzle by a plurality of kinds of gases, there are merits as follows: the number of nozzles can be reduced, thus reducing an apparatus cost, and facilitating maintenance.

As shown in FIG. 2, a first rod-type electrode 269 being a first electrode and a second rod-type electrode 270 being a second electrode having long structures, are disposed in the buffer chamber 237 in stacking direction of the wafers 200 extending from the lower part to the upper part of the reaction tube 203. The first rod-type electrode 269 and the second rod-type electrode 270 are respectively provided in parallel to the second nozzle 233b. The first rod-type electrode 269 and the second rod-type electrode 270 are respectively protected by being covered with an electrode protective tube 275 being the protective tube for protecting each electrode from the upper part to the lower part. One of the first rod-type electrode 269 and the second rod-type electrode 270, is connected to a high frequency power source 273 via a matching box 272, and the other one is connected to the earth being a referential potential. As a result, plasma is generated in a plasma generation region 224 between the first rod-type electrode 269 and the second rod-type electrode 270. A plasma source as a plasma generation unit (plasma generation part) is mainly constituted of the first rod-type electrode 269, the second rod-type electrode 270, the electrode protective tube 275, the matching box 272, and the high frequency power source 273. The plasma source functions as an activation mechanism for activating gas by plasma as described later.

The electrode protective tube 275 has a structure that each of the first rod-type electrode 269 and the second rod-type electrode 270 can be inserted into the buffer chamber 237 in a state of being isolated from atmosphere of the buffer chamber 237. Here, if the inside of the electrode protective tube 275 is set in the same atmosphere as outer air (atmospheric air), the first rod-type electrode 269 and the second rod-type electrode 270 respectively inserted into the electrode protective tube 275, are thermally oxidized by the heater 207. Therefore, an inert gas purge mechanism is provided inside of the electrode protective tube 275, for preventing oxidation of the first rod-type electrode 269 or the second rod-type electrode 270 by performing filling or purging with the inert gas such as nitrogen and suppressing an oxygen concentration to be sufficiently low.

The exhaust tube 231 for exhausting the atmosphere in the processing chamber 201, is provided in the reaction tube 203. A vacuum pump 246 as a vacuum-exhaust device is connected to the exhaust tube 231, through a pressure sensor 245 as a pressure detector (pressure detection part) for detecting a pressure in the processing chamber 201 and an APC (Auto Pressure Controller) valve 244 as a pressure adjustment unit (pressure adjustment part). The APC valve 244 is the open/close valve configured to perform vacuum-exhaust/stop of vacuum-exhaust of the inside of the processing chamber 201 by opening/closing a valve while operating the vacuum pump 246, and further adjust the pressure inside of the processing chamber 201 by adjusting a valve opening degree while operating the vacuum pump 246. The APC valve 244 is also configured to vacuum-exhaust the inside of the processing chamber 201 to a specific pressure (vacuum degree) by adjusting the opening degree of the APC valve 244 based on pressure information detected by the pressure sensor 245, while operating the vacuum pump 246. An exhaust system is mainly constituted of the exhaust tube 231, the APC valve 244, the vacuum pump 246, and the pressure sensor 245.

A seal cap 219 as a furnace throat lid member capable of air-tightly closing a lower end opening of the reaction tube 203, is provided in the lower part of the reaction tube 203. The seal cap 219 is configured to abut on the lower end of the reaction tube 203 from a vertically lower side. The seal cap 219 is made of metal such as stainless, etc., and is formed into a disc shape. An O-ring 220 as a seal member abutted on the lower end of the reaction tube 203, is provided on an upper surface of the seal cap 219. A rotation mechanism 267 for rotating the boat 217 as a substrate holder described later, is installed on an opposite side of the processing chamber 201 across the seal cap 219. A rotary shaft 255 of the rotation mechanism 267 is connected to the boat 217 passing through the seal cap 219. The rotation mechanism 267 is configured to rotate the wafers 200 by rotating the boat 217. The seal cap 219 is configured to be vertically elevated by a boat elevator 115 as an elevation mechanism vertically installed outside of the reaction tube 203. The boat elevator 115 is configured to load and unload the boat 217 into/from the processing chamber 201 by elevating the seal cap 219.

The boat 217 as a substrate supporter is made of a heat resistant material such as quartz or silicon carbide, etc., and is configured to support a plurality of wafers 200 in a horizontal posture, so as to be arranged with centers thereof aligned, in multiple stages. A heat insulating member 218 made of the heat resistant material such as quartz or silicon carbide, etc., is provided under the boat 217, so that heat from the heater 207 is hardly transmitted to the seal cap 219 side. The heat insulating member 218 may also be constituted of a plurality of heat insulating boards made of the heat resistant material such as quartz or silicon carbide, etc., and a heat insulating board holder for supporting these heat insulating boards in the horizontal posture in multiple stages.

A temperature sensor 263 as a temperature detector is installed in the reaction tube 203, and by adjusting a power supply state to the heater 207 based on the temperature information detected by the temperature sensor 263, the temperature in the processing chamber 201 shows a desired temperature distribution. Similarly to the first nozzle 233a and the second nozzle 233b, the temperature sensor 263 is formed into the L-shape, and is provided along the inner wall of the reaction tube 203.

Figure 6:
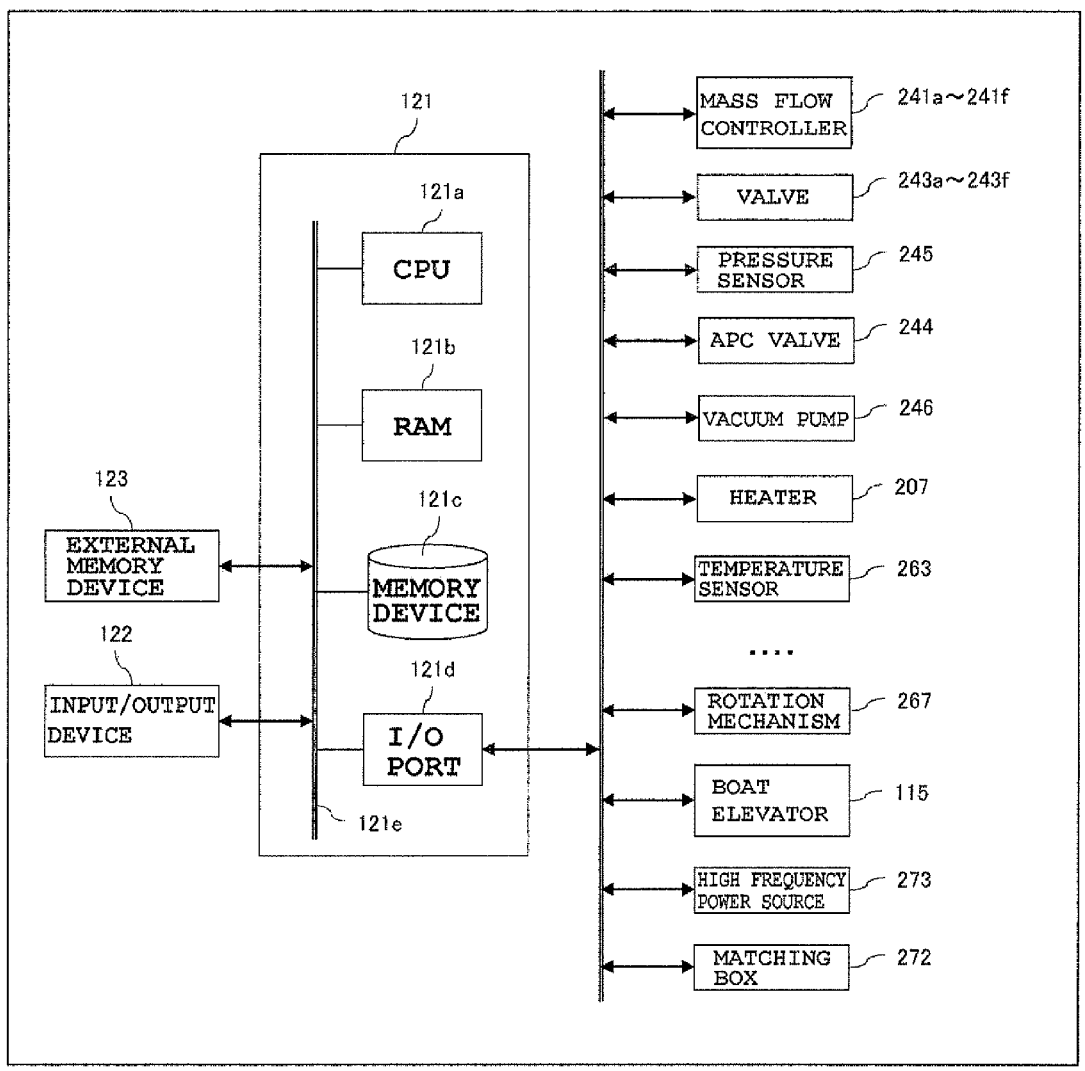
FIG. 6 is a schematic block diagram of a controller of the substrate processing apparatus suitably used in this embodiment.

As shown in FIG. 6, a controller 121 as the control part (control unit) is configured as a computer including CPU (Central Processing Unit) 121a, RAM (Random Access Memory) 121b, a memory device 121c, and I/O port 121d. The RAM 121b, the memory device 121c, and the I/O port 121d are configured to exchange data with the CPU 121a via an internal bus 121e. An input/output device 122 configured as a touch panel, etc., for example, is connected to the controller 121.

The memory device 121c is constituted of a flash memory, and HDD (Hard Disk Drive), etc., for example. A control program for controlling an operation of the substrate processing apparatus, or a process recipe, etc., indicating a procedure and a condition, etc., for processing a substrate described later, are readably stored in the memory device 121c. The process recipe is a combination of recipes, so that each procedure in a substrate processing step described later is executed by the controller 121 to obtain a specific result, thus functioning as a program. The process recipe and the control program, etc., are generally simply called a program. In a case of using the term of program in this specification, this case includes a case of including only the process recipe alone, and a case of including only the control program alone, or both cases of them. Further, the RAM 121b is configured as a memory area (work area) in which the program and data, etc., read by the CPU 121a are temporarily stored.

The I/O port 121d is connected to the above-mentioned mass flow controllers 241a, 241b, 241c, 241d, 241d, 241f, valves 243a, 243b, 243c, 243d, 243e, 243f, pressure sensor 245, APC valve 244, vacuum pump 246, heater 207, temperature sensor 263, rotation mechanism 267, boat elevator 115, high frequency power source 273, and matching box 272, etc.

The CPU 121a is configured to read and execute the control program from the memory device 121c, and is configured to read the process recipe from the memory device 121c according to an input, etc., of an operation command from the input/output device 122. Then, the CPU 121a is configured to control a flow rate adjustment operation of each kind of gas by the mass flow controllers 241a, 241b, 241c, 241d, 241e, 241f, an open/close operation of the valves 243a, 243b, 243c, 243d, 243e, 243f, a pressure adjustment operation based on the pressure sensor 245 by opening and closing operation of the APC valve 244, a temperature adjustment operation of the heater 207 based on the temperature sensor 263, a rotation speed adjustment operation of the rotation mechanism 267, and an elevating operation of the boat 217 by the boat elevator 115, power supply of the high frequency power source 273, and an impedance adjustment operation, etc., by the matching box 272.

The controller 121 may be configured not only as a dedicated computer, but also as a general-purpose computer. For example, an external memory device 123 storing the above-mentioned program (for example, a magnetic tape, a magnetic disc such as a flexible disc and a hard disc, etc., an optical disc such as CD and DVD, etc., an optical magnetic disc such as MO, etc., and a semiconductor memory such as a USB memory and a memory card, etc.), is prepared, and by using the external memory device 123, the program is installed in the general-purpose computer, to thereby constitute the controller 121 according to this embodiment. Means for supplying the program to the computer, is not limited to a case of supplying it through the external memory device 123. For example, communication means such as Internet and a dedicated line, etc., may be used, to thereby supply the program not through the external memory device 123. The memory device 121c or the external memory device 123 is configured as a computer readable recording medium. They are simply called a recording medium as a general term. In a case of using the term of the recording medium in this specification, this case includes a case of including only the memory device 121c alone, and a case of including only external memory device 123 alone, or both cases of them.

(2) Substrate Processing Step

Next, explanation is given for an example of forming the oxynitride film on the substrate as the insulating film using the processing furnace of the above-mentioned substrate processing apparatus, as one step of the manufacturing step of a semiconductor device. In the explanation hereafter, an operation of each part constituting the substrate processing apparatus is controlled by the controller 121.

Figure 3:
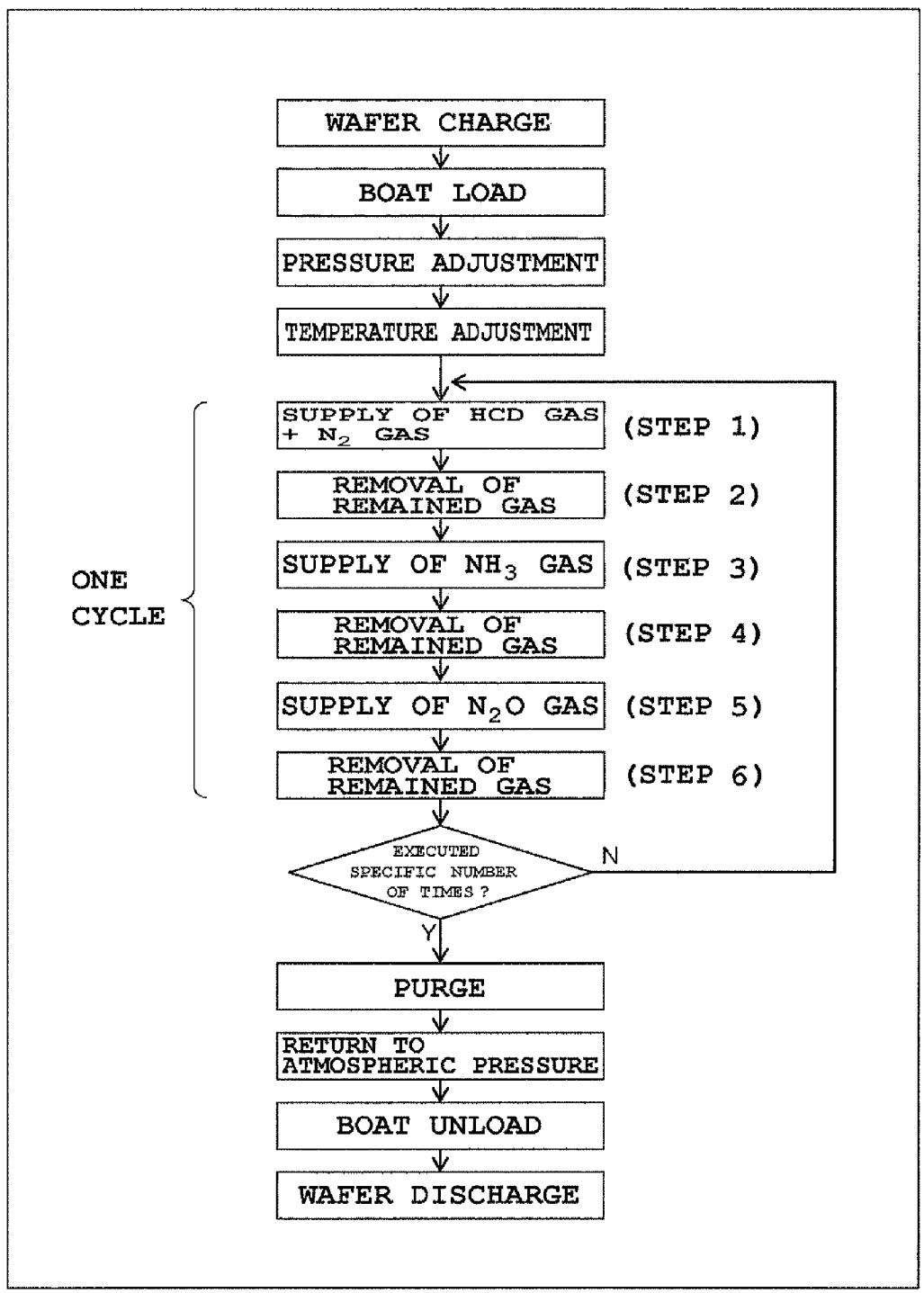
FIG. 3 is a view showing a film formation flow according to this embodiment.
Figure 4:
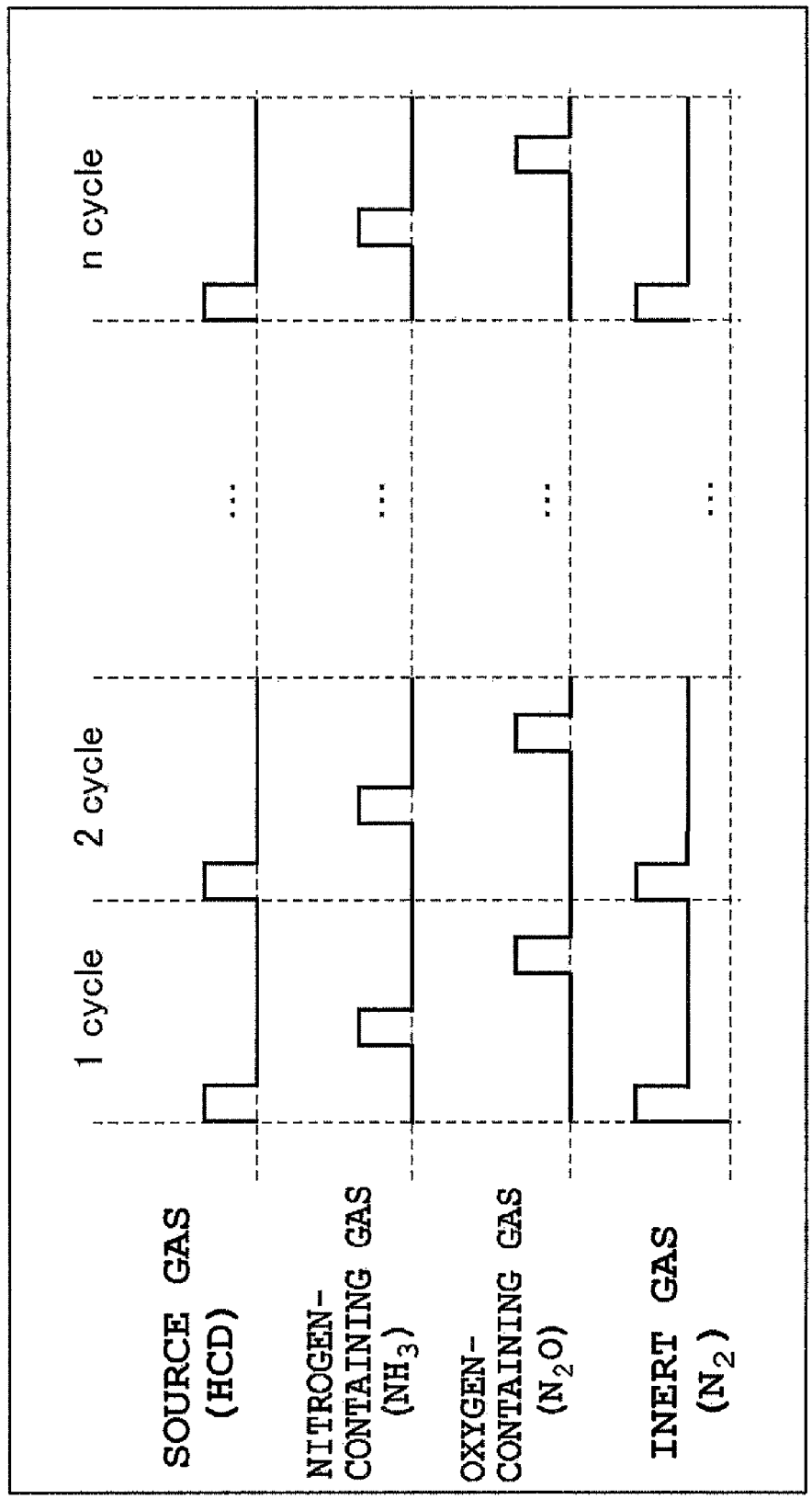
FIG. 4 is a view showing a timing of supplying gas in a film formation sequence of an oxynitride film according to this embodiment, and shows an example of using an inert gas as a deposition/adsorption inhibiting gas.
Figure 5:
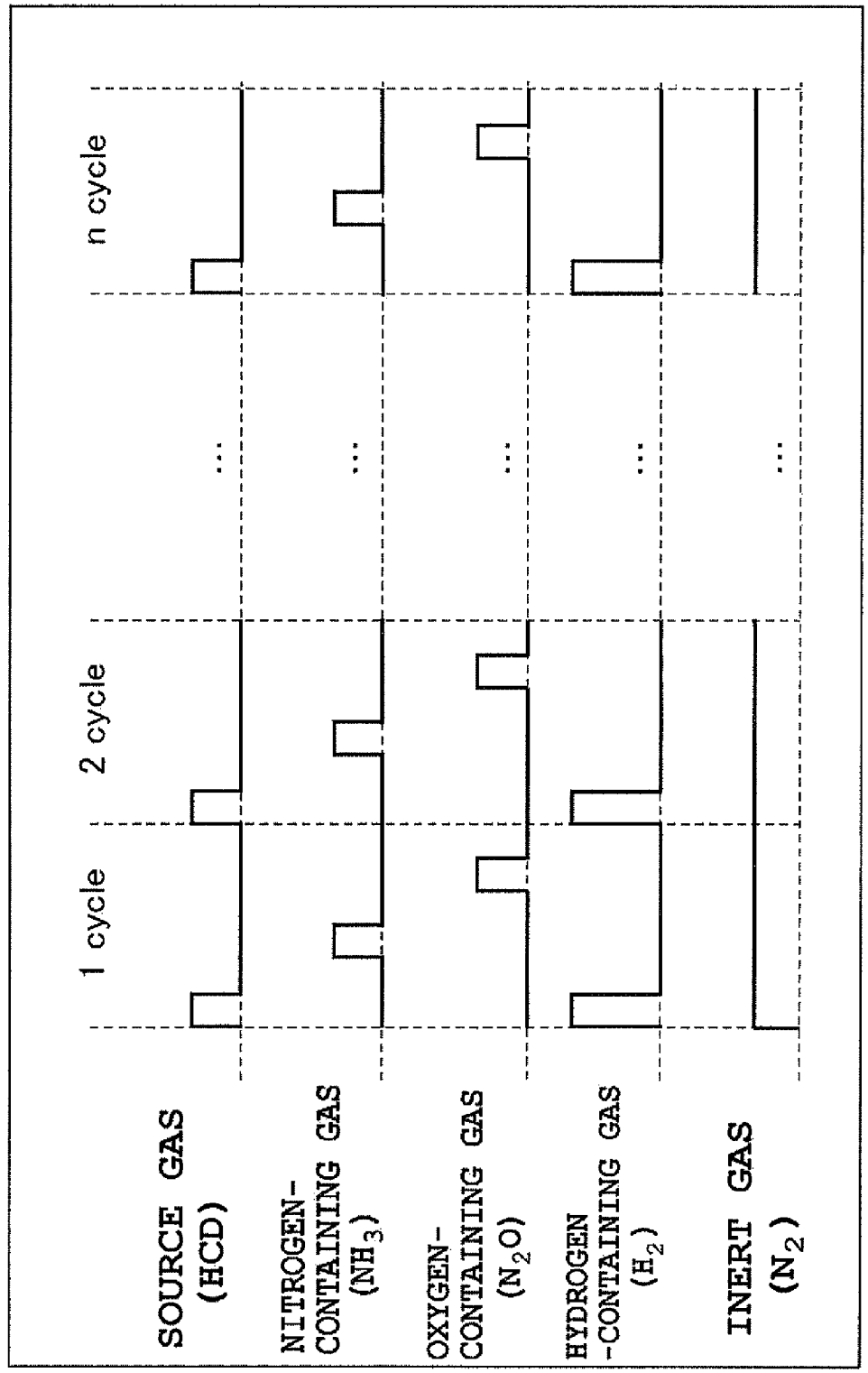
FIG. 5 is a view showing the timing of supplying gas in the film formation sequence of the oxynitride film according to this embodiment, and shows an example of using a hydrogen-containing gas as the deposition/adsorption inhibiting gas.

FIG. 3 is a film formation flowchart according to this embodiment, and FIG. 4 and FIG. 5 show a timing chart of supplying gas in a film formation sequence of the oxynitride film according to this embodiment. In the film formation sequence of this embodiment, a silicon oxynitride film is formed on the substrate as the oxynitride film, by alternately repeating: forming a silicon-containing layer as a specific element-containing layer on the substrate by supplying a source gas containing silicon as a specific element, to the substrate heated in a processing vessel, under a condition that a thermal decomposition reaction of the source gas is caused; changing the silicon-containing layer to a silicon nitride layer as a nitride layer by supplying a nitrogen-containing gas to the substrate heated in the processing vessel under pressurized atmosphere of less than atmospheric pressure; and changing the silicon nitride layer to a silicon oxynitride layer as an oxynitride layer by supplying an oxygen-containing gas to the substrate heated in the processing vessel under pressurized atmosphere of less than atmospheric pressure, interposing into the above sequences, purging of an inside of the processing vessel by supplying an inert gas into the processing vessel. In forming the silicon-containing layer, the source gas is supplied to the substrate through the nozzle provided at the lateral side of the substrate, and at this time, the inert gas or the hydrogen-containing gas as the deposition/adsorption inhibiting gas, is supplied to the substrate through the nozzle together with the source gas, to thereby spray the source gas in parallel to the surface of the substrate more strongly than the case of spraying the inert gas in parallel to the surface of the substrate in purging the inside of the processing vessel.

More specific explanation will be given hereafter. In this embodiment, explanation is given for an example of forming the silicon oxynitride film (SiON film) on the wafer 200 by using the HCD gas as the source gas, using the $NH_3$ gas as the nitrogen-containing gas, using the $N_2O$ gas as the oxygen-containing gas, using the $N_2$ gas or the $H_2$ gas as the deposition/adsorption inhibiting gas, and using the $N_2$ gas as the purge gas.

When a plurality of wafers 200 are charged in the boat 217, as shown in FIG. 1, the boat 217 supporting the plurality of wafers 200, is elevated by the boat elevator 115 and is loaded into the processing chamber 201 (boat load). In this state, the seal cap 219 is set in a state of sealing the lower end of the reaction tube 203 interposing the O-ring 220.

The inside of the processing chamber 201 is vacuum-exhausted by the vacuum pump 246 so as to be a desired pressure (degree of vacuum). At this time, the pressure in the processing chamber 201 is measured by the pressure sensor 245, and based on the pressure information detected by the pressure sensor 245, the opening degree of the APC valve 244 is feedback-controlled (pressure adjustment). The vacuum pump 246 is maintained in a regular operation mode until the processing applied to at least the wafer 200 is ended. Further, the inside of the processing chamber 201 is heated by the heater 207 so as to be the desired temperature. At this time, the power supply state to the heater 207 is feedback-controlled based on the temperature information detected by the temperature sensor 263 so that the inside of the processing chamber 201 shows the desired temperature distribution (temperature adjustment). Subsequently, rotations of the boat 217 and the wafers 200 are started by the rotation mechanism 267. The rotations of the boat 217 and the wafers 200 by the rotation mechanism 267 are continuously performed until the processing applied to at least the wafer 200 is completed.

Thereafter, following six steps, namely steps 1 to 6 are sequentially executed.

[Step 1]

The valve 243a of the first gas supply tube 232a and the valve 243d of the inert gas supply tube 232d are opened, to thereby flow the HCD gas to the first gas supply tube 232a, and flow the N₂ gas as the deposition/adsorption inhibiting gas to the first inert gas supply tube 232d. The N₂ gas flows from the first inert gas supply tube 232d, with the flow rate adjusted by the mass flow controller 241d. The HCD gas flows from the first gas supply tube 232a, with the flow rate adjusted by the mass flow controller 241a. The HCD gas with the flow rate adjusted, is mixed with the N₂ gas with the flow rate adjusted, in the first gas supply tube 232a, and is supplied into the processing chamber 201 in a heated and depressurize state from the gas supply holes 248a of the first nozzle 233a, and is exhausted from the exhaust tube 231 (supply of HCD gas+N₂ gas). At this time, in order to prevent an invasion of the HCD gas into the second nozzle 233b and the buffer chamber 237, the valves 243e, 243f are opened, to thereby flow the N₂ gas into the second inert gas supply tube 232e and the third inert gas supply tube 232f. The N₂ gas is supplied into the processing chamber 201 through the second gas supply tube 232b, the third gas supply tube 232c, the second nozzle 233b, and the buffer chamber 237, and is exhausted from the exhaust tube 231.

At this time, the APC valve 244 is properly adjusted, to thereby maintain the pressure inside of the processing chamber 201 to less than atmospheric pressure, for example to the pressure in a range of 10 to 1000 Pa for example. The supply flow rate of the HCD gas controlled by the mass flow controller 241a is set to the flow rate in a range of 20 to 1000 sccm (0.02 to 1 slm) for example. The supply flow rate of the N₂ gas as the deposition/adsorption inhibiting gas controlled by the mass flow controller 241d is set to a larger flow rate than the flow rate of the HCD gas, and set to the flow rate in a range of 1000 to 20000 sccm (1 to 20 slm) for example. The time for exposing the HCD gas to the wafer 200 is set to the time in a range of 1 to 120 seconds for example. The temperature of the heater 207 is set so that a CVD reaction occurs in the processing chamber 201 in the above-mentioned pressure zone. Namely, the temperature of the heater 207 is set so that the temperature of the wafer 200 is the temperature in a range of 350 to 950° C. for example, preferably 700 to 950° C., more preferably 750 to 950° C., and further preferably 800 to 950° C. When the temperature of the wafer 200 is less than 350° C., HCD is hardly decomposed or adsorbed on the wafer 200. Further, when the temperature of the wafer 200 exceeds 950° C., an excessively strong CVD reaction occurs, and therefore an action of the deposition/adsorption inhibiting gas cannot be sufficiently exhibited, thus making it difficult to improve a deterioration of the uniformity of the film thickness. Meanwhile, when the temperature of the wafer 200 is less than 700° C., the uniformity of the film thickness is relatively satisfactory, and the deterioration of the uniformity of the film thickness becomes remarkable in a high temperature region of 700° C. or more. In this case, the present invention using the deposition/adsorption inhibiting gas is particularly effective. Further, when the temperature of the wafer 200 is less than 800° C., and particularly less than 750° C., hydrogen taken into the film is easily remained, and a film with a large adsorption site of hydrogen (many defects) and low density, is formed. As described above, the temperature of the wafer 200 is preferably set to 350 to 950° C., preferably 700 to 950° C., more preferably 750 to 950° C., and further preferably 800 to 950° C. By setting the temperature of the wafer 200 to 750 to 950° C., and further preferably 800 to 950° C., the action of the deposition/adsorption inhibiting gas can be sufficiently exhibited, and the hydrogen taken into the film is hardly remained (easily desorbed), and a film with a small adsorption site of hydrogen (less defects) and high density can be formed. Namely, in this temperature zone, the film with extremely low hydrogen concentration and extremely excellent uniformity of the film thickness, can be formed.

By supplying the HCD gas into the processing chamber 201 under the above-mentioned condition, namely under the condition that the CVD reaction is caused, a silicon layer is formed on the wafer 200 (on the surface of the underlayer), as a silicon-containing layer of less than one atomic layer to about several atomic layers. The silicon-containing layer may be an adsorption layer of the HCD gas. Here, the silicon layer is a general term including a continuous layer, a discontinuous layer made of silicon, and a silicon thin film composed of an overlap of these layers. The continuous layer made of silicon is also called the silicon thin film. Further, the adsorption layer of the HCD gas includes a continuous chemical adsorption layer, a discontinuous chemical adsorption layer composed of gas molecules of the HCD gas. The layer of less than one atomic layer means the atomic layer formed discontinuously. The silicon layer is formed by depositing silicon on the wafer 200, under a condition that the HCD gas is self-decomposed (thermally decomposed), namely under a condition that the thermal decomposition reaction of the HCD is caused. The adsorption layer of the HCD gas is formed by adsorption of the HCD gas on the wafer 200, under a condition that the HCD gas is not self-decomposed (thermally decomposed), namely, under the condition that the thermal decomposition reaction of the HCD is not caused. If the thickness of the silicon-containing layer formed on the wafer 200 exceeds several atomic layers, a nitriding action in step 3 and an oxidizing action in step 5 described later don't reach the whole body of the silicon-containing layer. Further, a minimal value of the silicon-containing layer that can be formed on the wafer 200 is less than one atomic layer. Therefore, the thickness of the silicon-containing layer is preferably set to less than one atomic layer to about several atomic layers. The film formation rate can be preferably higher in a case of forming the silicon layer on the wafer 200, than a case of forming the adsorption layer of the HCD gas on the wafer 200.

At this time, as described above, by supplying a large flow rate of the N₂ gas, as the deposition/adsorption inhibiting gas together with the HCD gas, from the same nozzle as the first nozzle 233a for supplying the HCD gas, the flow velocity of the HCD gas, particular the flow velocity of the HCD gas flowing in parallel to the surface of the wafer 200 (crossing the surface of the wafer 200), can be made fast. Namely, spray of the HCD gas in parallel to the surface of the wafer 200 can be made strong. Thus, the silicon-containing layer can be formed on the wafer 200 while lowering a deposition efficiency of silicon on the wafer 200 or suppressing an adsorption efficiency of the HCD gas on the wafer 200. By such an action of the deposition/adsorption inhibiting gas, a deposition or an adsorption center of the silicon-containing layer can be moved closer to the center from the edge side of the wafer 200 as shown in FIG. 7, and a difference can be narrowed between a thickest portion and a thinnest portion of the silicon-containing layer, thus making it possible to uniformly form the silicon-containing layer even in an area where an adsorption reaction collapses in a high temperature zone of 700° C. or more for example, namely in an area where the deposition or the adsorption of the silicon-containing layer occurs excessively.

Figure 7:
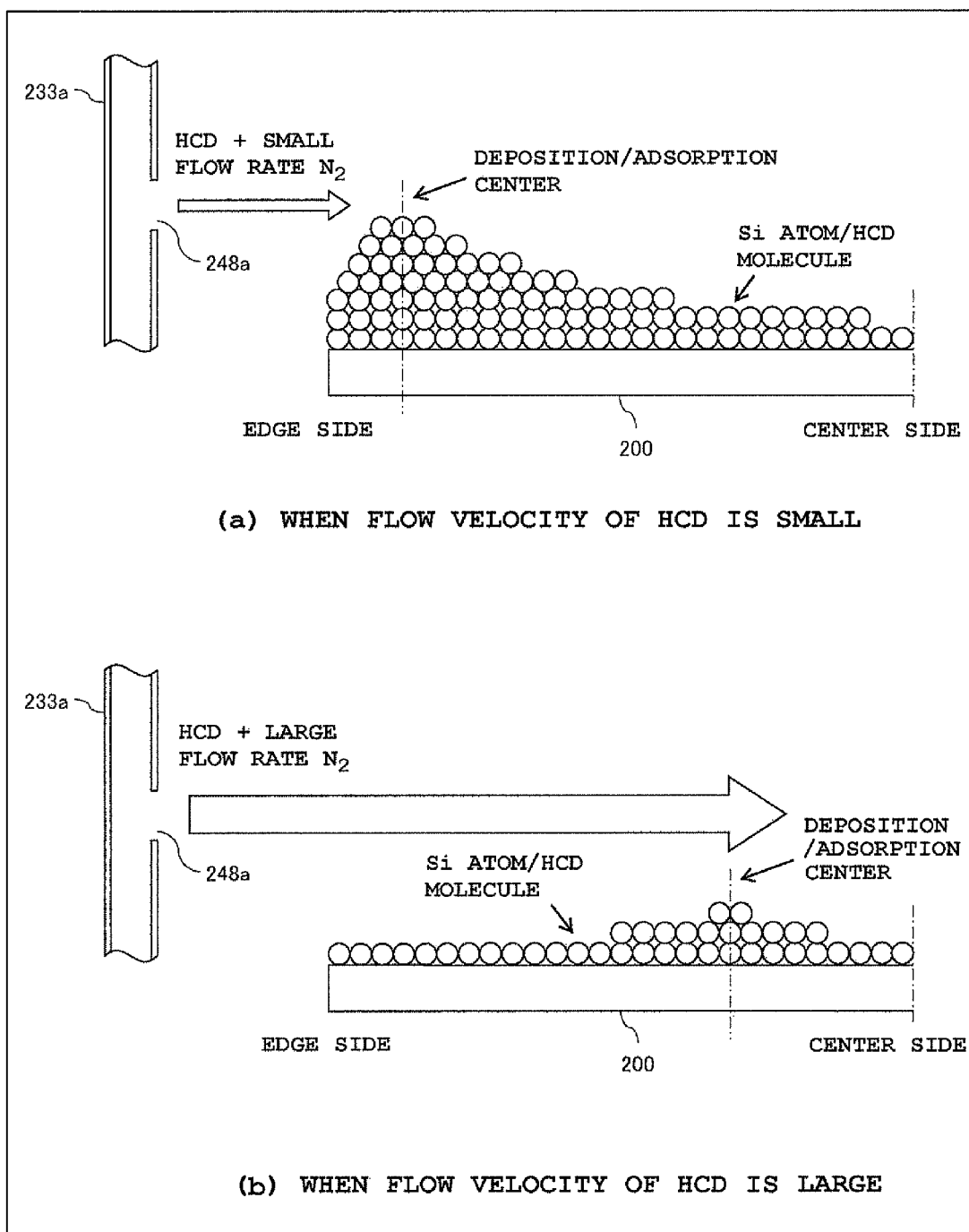
FIG. 7 is a view schematically showing a state of deposition of silicon or adsorption of an HCD gas, wherein (a) shows a case of a small flow velocity of the HCD gas, and (b) shows a case of a large flow velocity of the HCD gas respectively.

FIG. 7(a) is a view schematically showing a state of the deposition of silicon or the adsorption of the HCD gas in a case of a small flow velocity of the HCD gas flowing in parallel to the surface of the wafer 200. Further, FIG. 7(b) is a view schematically showing a state that the deposition of silicon or the adsorption of the HCD gas in a case of a large flow velocity of the HCD gas flowing in parallel to the surface of the wafer 200. Outline arrows in FIG. 7 show flowing directions of the HCD gas and the $N_2$ gas, and white circles (◦) on the wafer 200 show Si atoms deposited on the wafer 200, or HCD gas molecules adsorbed on the wafer 200. Further, in FIG. 7, only a left half of the wafer 200 is shown for the convenience.

As shown in FIG. 7, the deposition or the adsorption center of the silicon-containing layer can be moved closer to the center from the edge side of the wafer 200, while setting the thickness of the silicon-containing layer to be small as a whole, by increasing the flow velocity of the HCD gas flowing in parallel to the surface of the wafer 200. Also, the difference can be narrowed between the thickest portion and the thinnest portion of the silicon-containing layer, and the silicon-containing layer can be uniformly formed in a plane of the wafer 200.

The supply flow rate of the $N_2$ gas as the deposition/adsorption inhibiting gas, is preferably set to the flow rate in the range of 1 to 20 slm as described above, and is preferably set to a larger flow rate than the supply flow rate of the HCD gas. By thus setting the supply flow rate of the $N_2$ gas, and setting a volume flow rate of the $N_2$ gas to be larger than the volume flow rate of the HCD gas, the flow velocity of the HCD gas flowing in parallel to the surface of the wafer 200 is set to be faster than a case of flowing the HCD gas alone. Namely, the HCD gas is sprayed in parallel to the surface of the wafer 200 more strongly than the case of flowing the HCD gas alone. Further, the supply flow rate of the $N_2$ gas as the deposition/adsorption inhibiting gas is preferably set to be larger than the supply flow rate of the $NH_3$ gas and the $N_2O$ gas supplied into the processing chamber 201 in steps 3 and 5 described later. By thus setting the supply flow rate of the $N_2$ gas, and setting a volume flow rate of the $N_2$ gas to be larger than the volume flow rate of the $NH_3$ gas and the $N_2O$ gas, the flow velocity of the HCD gas flowing in parallel to the surface of the wafer 200 is set to be faster than the case of flowing the $NH_3$ gas and the $N_2O$ gas in parallel to the surface of the wafer 200. Namely, the HCD gas is sprayed in parallel to the surface of the wafer 200 more strongly than the case of flowing the $NH_3$ gas and the $N_2O$ gas in parallel to the surface of the wafer 200. Further, the supply flow rate of the $N_2$ gas as the deposition/adsorption inhibiting gas is preferably set to be larger than the supply flow rate of the $N_2$ gas as the purge gas supplied into the processing chamber 201 in steps 2, 4, and 6 described later. By thus setting the supply flow rate of the $N_2$ gas, and setting the volume flow rate of the $N_2$ gas as the deposition/adsorption inhibiting gas to be larger than the volume flow rate of the $N_2$ gas as the purge gas, the flow velocity of the HCD gas flowing in parallel to the surface of the wafer 200 is set to be faster than the flow velocity of the $N_2$ gas as the purge gas flowing in parallel to the surface of the wafer 200. Namely, the HCD gas is sprayed in parallel to the surface of the wafer 200 more strongly than the case of spraying the $N_2$ gas as the purge gas in parallel to the surface of the wafer 200.

Specifically, the volume flow rate of the $N_2$ gas as the deposition/adsorption inhibiting gas, is preferably set to about 10 to 30 times of the volume flow rate of the HCD gas, and about 5 to 30 times of the volume flow rate of the $N_2$ gas as the purge gas. By setting the volume flow rate of the $N_2$ gas as the deposition/adsorption inhibiting gas, to about 10 to 30 times of the volume flow rate of the HCD gas, the flow velocity of the HCD gas flowing in parallel to the surface of the wafer 200 can be sufficiently increased, and the deposition or the adsorption of the silicon-containing layer can be sufficiently suppressed, and the deposition or adsorption center can be easily set to a position closer to the center from the edge side of the wafer 200. Further, the difference can be easily narrowed between the thickest portion and the thinnest portion of the silicon-containing layer. As a result, the uniformity of the film thickness can be sufficiently improved. Further, the following situation can be prevented: namely, the flow velocity of the HCD gas is excessively increased, thus excessively suppressing the deposition or adsorption of the silicon-containing layer, and a practical film formation rate cannot be obtained.

As the source containing Si, not only an inorganic source such as STC (silicontetrachloride, namely tetrachlorosilane, $SiCl_4$), TCS (trichlorosilane, $SiHCl_3$), DCS (dichlorosilane, $SiH_2Cl_2$), MCS (monochlorosilane, $SiH_3Cl$), and $SiH_4$ (monosilane) other than HCD, but also an organic source such as aminosilane-based 4DMAS (tetrakisdimethylaminosilane, $Si[N(CH_3)_2]_4$), 3DMAS (trisdimethylaminosilane, $Si[N(CH_3)_2]_3H$), 2DEAS (bisdiethylaminosilane, $Si[N(C_2H_5)_2]_2H_2$), BTBAS (bistertiarybutylaminosilane, $SiH_2[NH(C_4H_9)]_2$), etc., may be used.

As the inert gas as the deposition/adsorption inhibiting gas, rare gases such as Ar gas, He gas, Ne gas, Xe gas, etc., other than the $N_2$ gas, may be used. Further, the hydrogen-containing gas may also be used as the deposition/adsorption inhibiting gas. As the hydrogen-containing gas, for example a hydrogen ($H_2$) gas and a heavy hydrogen ($D_2$) gas, etc., can be used. FIG. 5 shows an example of a film formation sequence using the $H_2$ gas being the hydrogen-containing gas as the deposition/adsorption inhibiting gas. Similarly to the supply flow rate of the $N_2$ gas as the deposition/adsorption inhibiting gas, the supply flow rate of the $H_2$ gas as the deposition/adsorption inhibiting gas, is set to the flow rate in the range of 1000 to 20000 sccm (1 to 20 slm). Hydrogen taken into the film is hardly remained (easily desorbed) under a high temperature of 750° C. or more, preferably 800° C. or more, and therefore even if the hydrogen-containing gas is used as the adsorption inhibiting gas, the effect of reducing the hydrogen concentration in the film, is not affected thereby. In this case as well, a high density film with a small hydrogen adsorption site (having less defects) is formed. By supplying the $H_2$ gas during supply of the HCD gas, Cl in the HCD gas is probably extracted, and the film formation rate is improved and the effect of reducing Cl impurity in the film can be obtained.

[Step 2]

After the silicon-containing layer is formed on the wafer 200, the valve 243a of the first gas supply tube 232a is closed, to thereby stop the supply of the HCD gas. At this time, the APC valve 244 of the exhaust tube 231 is left opened, to thereby vacuum-exhaust the inside of the processing chamber 201 by the vacuum pump 246, and an unreacted HCD gas or the HCD gas after contributing to the formation of the silicon-containing layer remained in the processing chamber 201, is removed from the processing chamber 201. At this time, the valves 243d, 243e, and 243f are left opened, to thereby maintain the supply of the $N_2$ gas into the processing chamber 201 as the inert gas. The $N_2$ gas actions as the purge gas, thus further enhancing the effect of removing the unreacted HCD gas or the HCD gas after contributing to the formation of the silicon-containing layer remained in the processing chamber 201 (removal of the remained gas). At this time, the gas remained in the processing chamber 201 is not required to be completely removed, and the inside of the processing chamber 201 may not be completely purged. In a case of a slight amount of the gas remained in the processing chamber 201, an adverse influence is not generated in step 3 performed thereafter. At this time, the flow rate of the $N_2$ gas supplied into the processing chamber 201, is not required to be large, and for example, by supplying the same amount as the volume of the processing tube 203 (processing chamber 201), purge of not generating the adverse influence can be performed in step 3. Thus, by not completely purging the inside of the processing chamber 201, a purging time can be shortened, and the throughput can be improved. Further, consumption of the N$_2$ gas can be suppressed to a necessary minimum.

The temperature of the heater 207 at this time is set so that the temperature of the wafer 200 is set to the temperature in a range of 350 to 950° C., preferably 700 to 950° C., more preferably 750 to 950° C., and further preferably 800 to 950° C., similarly to the case of supplying the HCD gas. The supply flow rate of the N$_2$ gas as the purge gas, is set to the flow rate in the range of 200 to 1000 sccm (0.2 to 1 slm). The volume flow rate of the N$_2$ gas as the purge gas, is not required to be large like the volume flow rate of the N$_2$ gas as the deposition/adsorption inhibiting gas, and a sufficient purge effect can be obtained even in a case of a smaller flow rate than the volume flow rate of the N$_2$ gas. Conversely, the volume flow rate of the N$_2$ gas as the deposition/adsorption inhibiting gas is required to be larger than the volume flow rate of the N$_2$ gas as the purge gas. Namely, in order to obtain a deposition/adsorption suppressing effect of the silicon-containing layer, the volume flow rate of the N$_2$ gas as the deposition/adsorption inhibiting gas is required to be larger than the volume flow rate of the N$_2$ gas capable of sufficiently obtaining the purge effect. Therefore, when the remained gas in the processing chamber 201 is removed by purging, the mass flow controller 241d is controlled, to thereby change the supply flow rate of the N$_2$ gas supplied from the first inert gas supply tube 232d, from the range of 1 to 20 slm to the range of 0.2 to 1 slm, and reduce the volume flow rate of the N$_2$ gas. As the purge gas, rare gases such as Ar gas, He gas, Ne gas, and Xe gas, etc., may be used other than the N$_2$ gas.

[Step 3]

After the remained gas in the processing chamber 201 is removed, the valve 243b of the second gas supply tube 232b is opened, to thereby flow the NH$_3$ gas to the second gas supply tube 232b. The NH$_3$ gas flows from the second gas supply tube 232b, with the flow rate adjusted by the mass flow controller 241b. The NH$_3$ gas with the flow rate adjusted, is supplied into the buffer chamber 237 in a heated and depressurized state, from the gas supply holes 248b of the second nozzle 233b. At this time, the high frequency power is not applied between the first rod-type electrode 269 and the second rod-type electrode 270. Thus, the NH$_3$ gas supplied into the buffer chamber 237, is thermally activated and is supplied into the processing chamber 201 in the heated and depressurized state and is exhausted from the exhaust tube 231 (Supply of the NH$_3$ gas). At this time, in order to prevent the invasion of the NH$_3$ gas into the first nozzle 233a, the valve 243d is opened, to thereby flow the N$_2$ gas into the first inert gas supply tube 232d. The N$_2$ gas is supplied into the processing chamber 201 through the first gas supply tube 232a and the first nozzle 233a, and is exhausted from the exhaust tube 231.

At this time, it is also acceptable that the valve 243e of the second inert gas supply tube 232e is opened, to thereby supply the N$_2$ gas from the second inert gas supply tube 232e as the inert gas. The N$_2$ gas is supplied into the second gas supply tube 232b, with the flow rate adjusted by the mass flow controller 241e. In this case, a mixed gas of the NH$_3$ gas and the N$_2$ gas is supplied from the second nozzle 233b. As the inert gas, rare gases such as Ar gas, He gas, Ne gas, and Xe gas, etc., may be used other than the N$_2$ gas.

At this time, the APC valve is properly adjusted, to thereby maintain the pressure in the processing chamber 201 to a pressure of less than atmospheric pressure, and for example the pressure in a range of 1 to 3000 Pa. The supply flow rate of the NH$_3$ gas controlled by the mass flow controller 241b is set to the flow rate in a range of 100 to 10000 sccm (0.1 to 10 slm) for example. The time required for exposing the NH$_3$ gas to the wafer 200 is set to the time in a range of 1 to 120 seconds for example. The temperature of the heater 207 is set so that the temperature of the wafer 200 is the temperature in a range of 350 to 1200° C. for example. In such a range of the temperature, it is confirmed that an effect of nitriding by the NH$_3$ gas under a depressurized atmosphere, namely a nitriding reaction of the silicon-containing layer can be obtained. It is also confirmed that if the temperature of the wafer 200 is excessively low, the nitriding effect cannot be obtained. However, in consideration of the throughput, the temperature of the heater 207 is preferably set so that the temperature of the wafer 200 is the temperature of allowing the nitriding reaction to occur in the silicon-containing layer, and the temperature in the processing chamber 201 is maintained in the same temperature zone in step 1 and step 3. In this case, the temperature of the heater 207 is set so that the temperature of the wafer 200, namely the temperature in the processing chamber 201 is set to a constant temperature in the range of 350 to 950° C., preferably 700 to 950° C., more preferably 750 to 950° C., and further preferably 800 to 950° C., in step 1 and step 3. Further, the temperature of the heater 207 is preferably set so that the temperature in the processing chamber 201 is set in a similar temperature zone through step 1 to step 6 (described later). In this case, the temperature of the heater 207 is set so that the temperature in the processing chamber 201 is set to the constant temperature in a range of 350 to 950° C., preferably 700 to 950° C., more preferably 750 to 950° C., and further preferably 800 to 950° C. through step 1 to step 6 (described later). By setting the temperature in the processing chamber 201 to 550° C. or more, the effect of improving the nitriding power by the NH$_3$ gas in the depressurized atmosphere, can be obtained. When the effect of improving the nitriding power is achieved, the temperature in the processing chamber 201 is preferably set to 600° C. or more, and is further preferably set to 700° C. or more. A softer reaction can be caused by supplying the thermally activated NH$_3$ gas, than a case of supplying the NH$_3$ gas activated by plasma, wherein nitriding described later can be softly performed.

By supplying the NH$_3$ gas into the processing chamber 201 under the above-mentioned condition, the NH$_3$ gas is thermally activated or is thermally decomposed by non-plasma under the heated and depressurized atmosphere, to thereby generate nitriding species containing nitrogen. At this time, the HCD gas does not flow in the processing chamber 201, and therefore the NH$_3$ gas does not cause a vapor phase reaction, and the niriding species obtained by thermally activating the NH$_3$ gas or thermally decomposing the NH$_3$ gas, are reacted with at least a part of the silicon-containing layer formed on the wafer 200 in step 1. Thus, nitriding treatment is applied to the silicon-containing layer, and by such a nitriding treatment, the silicon-containing layer is changed (modified) to a silicon nitride layer (Si$_3$N$_4$ layer, simply called a SiN layer hereafter).

At this time, the NH$_3$ gas activated by plasma can also be flowed. By flowing the NH$_3$ gas activated by plasma, following effects can be considered: namely, the nitriding species with higher energy can be generated, and by performing the nitriding treatment by such nitriding species, device characteristic can be improved. When the NH$_3$ gas is activated by plasma, the high frequency power is applied between the first rod-type electrode 269 and the second rod-type electrode 270 from the high frequency power source 273 through the matching box 272, to thereby excite the NH$_3$ gas supplied into the buffer chamber 237 by plasma, and the excited NH$_3$ gas is supplied into the processing chamber 201 from the gas supply holes 248c as active species, and is exhausted from the exhaust tube 231. At this time, the high frequency power applied between the first rod-type electrode 269 and the second rod-type electrode 270 from the high frequency power source 273, is set to the electric power in a range of 50 to 1000 W for example. The other processing condition is set to be the same as the above-mentioned processing condition. In the above-mentioned temperature zone, the $NH_3$ gas is sufficiently thermally activated, and a sufficient amount of nitriding species is generated. Therefore, a sufficient nitriding power can be obtained even if the $NH_3$ gas is thermally activated by non-plasma. A softer reaction can be caused by supplying the thermally activated $NH_3$ gas, wherein nitriding described above can be softly performed.

As the nitrogen-containing gas, diazene ($N_2H_2$) gas, hydrazine ($N_2H_4$) gas, and $N_3H_8$ gas, or an amine-based gas, etc., may be used other than the $NH_3$ gas.

[Step 4]

After the silicon-containing layer is changed to the silicon nitride layer, the valve 243b of the second gas supply tube 232b is closed, to thereby stop the supply of the $NH_3$ gas. At this time, the APC valve 244 of the exhaust tube 231 is left opened, to thereby vacuum-exhaust the inside of the processing chamber 201 by the vacuum pump 246, and remove the unreacted $NH_3$ gas or the $NH_3$ gas after contributing to the formation of the silicon nitride layer or reaction byproducts remained in the processing chamber 201. At this time, by leaving the valves 243d, 243e, 243f opened, the supply of the $N_2$ gas into the processing chamber 201 as the inert gas, is maintained. The $N_2$ gas actions as the purge gas, thus further improving the effect of removing the unreacted $NH_3$ gas or the $NH_3$ gas after contributing to the formation of the silicon nitride layer or reaction byproducts remained in the processing chamber 201 (removal of the remained gas). At this time, the gas remained in the processing chamber 201 is not required to be completely removed, or the inside of the processing chamber 201 may not be completely purged. If a slight amount of the gas is remained in the processing chamber 201, the adverse influence is not generated in step 5 performed thereafter. The flow rate of the $N_2$ gas supplied into the processing chamber 201 is not required to be large, and for example, by supplying about the same amount as the volume of the reaction tube 203 (processing chamber 201), the purge of not causing the adverse influence can be performed in step 5. Thus, by not completely purging the inside of the processing chamber 201, a purging time can be shortened, and the through put can be improved. Further, the consumption of the $N_2$ gas can be suppressed to necessary minimum.

The temperature of the heater 207 at this time, is set so that the temperature of the wafer 200 is set to the temperature in the range of 350 to 950° C., preferably 700 to 950° C., more preferably 750 to 950° C., and further preferably 800 to 950° C., similarly to the supply of the $NH_3$ gas. The supply flow rate of the $N_2$ gas as the purge gas, is set to the flow rate in the range of 200 to 1000 sccm (0.2 to 1 slm). As described above, the volume flow rate of the $N_2$ gas as the purge gas is not required to be large as the volume flow rate of the $N_2$ gas as the deposition/adsorption inhibiting gas, and a sufficient purging effect can be obtained by the smaller flow rate than the volume flow rate of the $N_2$ gas. As the purge gas, rare gases such as Ar gas, He gas, Ne gas, and Xe gas, etc., may be used other than the $N_2$ gas.

[Step 5]

The silicon nitride layer formed in the above-mentioned step 1 to step 4, has excellent characteristics of extremely low hydrogen concentration, extremely low film stress, excellent uniformity of the film thickness, and few defects. However, this silicon nitride layer has a specific level of stress, and there is sometimes a defect in this silicon nitride layer, due to the strain caused by the stress. Also, there is sometimes a defect in the silicon nitride layer, due to loss of nitrogen. As described above, a trap site for capturing the electric charge is formed by these defects. Therefore, in this step, as described later, the defect in the silicon nitride layer can be further reduced while utilizing the excellent characteristic of the silicon nitride layer such that there are few defects, by applying oxidation treatment to the silicon nitride layer using the $N_2O$ gas with weak oxidizing power.

After the remained gas in the processing chamber 201 is removed, the valve 243c of the third gas supply tube 232c is opened, to thereby flow the $N_2O$ gas to the third gas supply tube 232c. The $N_2O$ gas flows from the third gas supply tube 232c, with the flow rate adjusted by the mass flow controller 241c. The $N_2O$ gas flows from the third gas supply tube 232c, with the flow rate adjusted by the mass flow controller 241c. The $N_2O$ gas with the flow rate adjusted is passed through the second gas supply tube 232b and is supplied into the buffer chamber 237 in the heated and depressurized state from the gas supply holes 248b of the second nozzle 233b. At this time, the high frequency power is not applied between the first rod-type electrode 269 and the second rod-type electrode 270. Thus, the $N_2O$ gas supplied into the buffer chamber 237 is thermally activated, and is supplied into the processing chamber 201 in the heated and depressurized state from the gas supply holes 248c of the buffer chamber 237, and is exhausted from the exhaust tube 231 (supply of the $N_2O$ gas). At this time, in order to prevent the invasion of the $N_2O$ gas into the first nozzle 233a, the valve 243d is opened, to thereby flow the $N_2$ gas into the first inert gas supply tube 232d. The $N_2$ gas is supplied into the processing chamber 201 through the first gas supply tube 232a and the first nozzle 233a, and is exhausted from the exhaust tube 231.

At this time, it is also acceptable that the valve 243f of the third inert gas supply tube 232f is opened, to thereby supply the $N_2$ gas from the third inert gas supply tube 232f as the inert gas. The $N_2$ gas is supplied into the third gas supply tube 232c with the flow rate adjusted by the mass flow controller 241f. In this case, a mixed gas of the $N_2O$ gas and the $N_2$ gas is supplied from the second nozzle 233b. As the inert gas, rare gases such as Ar gas, He gas, Ne gas, and Xe gas, etc., may be used other than the $N_2$ gas.

At this time, the APC valve is properly adjusted, to thereby maintain the pressure in the processing chamber 201 to the pressure of less than atmospheric pressure and for example the pressure in a range of 1 to 1000 Pa. The supply flow rate of the $N_2O$ gas controlled by the mass flow controller 241c is set to the flow rate in a range of 1000 to 10000 sccm (1 to 10 slm) for example. The time for exposing the $N_2O$ gas to the wafer 200 is set to the time in a range of 1 to 120 seconds for example. The temperature of the heater 207 is set so that the temperature of the wafer 200 is the temperature in a range of 350 to 1000° C. for example. However, in consideration of the throughput, the temperature of the heater 207 is preferably set so that the temperature of the wafer 200 shows a similar temperature zone as the temperature during supply of the HCD gas in step 1, and during supply of the $NH_3$ gas in step 3, namely the temperature in the processing chamber 201 is maintained in the similar temperature zone in steps 1, 3, 5. In this case, the temperature of the heater 207 is set so that the temperature of the wafer 200, namely the temperature in the processing chamber 201 is set to the constant temperature in the range of 350 to 950° C., preferably 700 to 950° C., more preferably 750 to 950° C., and further preferably 800 to 950°

C. in steps 1, 3, 5. Further, it is preferable to set the temperature of the heater 207 so that the temperature in the processing chamber 201 in the similar temperature zone through step 1 to step 6 (described later). In this case, the temperature of the heater 207 is set so that the temperature in the processing chamber 201 is set to the constant temperature in the range of 350 to 950° C., preferably 700 to 950° C., more preferably 750 to 950° C., and further preferably 800 to 950° C. through step 1 to step 6 (described later). In order to obtain an oxidation effect by the $N_2O$ gas in the depressurized atmosphere, the temperature in the processing chamber 201 is required to be set to 350° C. or more. The temperature in the processing chamber 201 is preferably set to 400° or more, and further preferably set to 450° C. or more.

By supplying the $N_2O$ gas into the processing chamber 201 under the above-mentioned condition, the $N_2O$ gas is thermally activated or is thermally decomposed by non-plasma in the heated and depressurized atmosphere, to thereby generate oxidation species containing oxygen. At this time, the HCD gas does not flow into the processing chamber 201, and therefore the $N_2O$ gas does not cause the vapor phase reaction, and the oxidation species obtained by thermally activating the $N_2O$ gas or thermally decomposing the $N_2O$ gas, are reacted with at least a part of the silicon nitride layer formed on the wafer 200 in step 3. Thus, oxidation treatment is applied to the silicon nitride layer, and by such an oxidation treatment, the silicon nitride layer is changed (modified) to the silicon oxynitride layer (simply called a SiON layer hereafter). Thus, the defect in the silicon nitride layer (namely in the silicon oxynitride layer) can be further reduced. Namely, by supplying oxygen (O) atoms to the defect caused by the nitrogen loss or strain that exist in the silicon nitride layer, the defect in the silicon nitride layer can be further reduced. Moreover, by using the nitrous oxide ($N_2O$) gas with relatively weak oxidizing power compared with the $O_2$ gas, etc., the silicon nitride layer can be changed to the silicon oxynitride layer while allowing the nitrogen to be remained in the silicon nitride layer. Namely, by using the $N_2O$ gas with weak oxidizing power, the defect can be more effectively reduced while avoiding a new generation of the nitrogen loss. At this time, the oxidation reaction of the silicon nitride layer by the $N_2O$ gas, is preferably carried out so as not to be saturated. In order to make the oxidation reaction of the silicon nitride layer unsaturated, the above-mentioned processing condition may be used as the processing condition in step 5.

At this time, the $N_2O$ gas can also be activated by plasma and flowed. By flowing the $N_2O$ gas activated by plasma, the oxidation species with higher energy can be generated, and by performing oxidation treatment by this oxidation species, the effect of improving the device characteristic can also be obtained. For example, when the $N_2O$ gas is activated by plasma, the high frequency power is applied between the first rod-type electrode 269 and the second rod-type electrode 270 from the high frequency power source 273 through the matching box 272, to thereby plasma-excite the $N_2O$ gas supplied into the buffer chamber 237, which is then supplied into the processing chamber 201 as active species from the gas supply holes 248c, and is exhausted from the exhaust tube 231. At this time, the high frequency power applied between the first rod-type electrode 269 and the second rod-type electrode 270 from the high frequency power source 273, is set to the electric power in a range of 50 to 1000 W for example. The other processing condition is similar to the above-mentioned processing condition. In the above-mentioned temperature zone, the $N_2O$ gas is thermally activated to cause a sufficient reaction, so that a sufficient amount of oxidation species are generated. Therefore, even in a case of thermally activating the $N_2O$ gas by non-plasma, the sufficient oxidizing power can be obtained. A softer reaction can be caused by supplying the thermally activated $N_2O$ gas, and the above-mentioned oxidation treatment can be softly performed.

As the oxygen-containing gas, namely as an oxidized gas, a nitrogen oxide-based gas such as nitrous oxide (NO) gas and nitric monoxide ($NO_2$) gas, etc., may be used other than the $N_2O$ gas. Namely, as the oxygen-containing gas, the oxidizing power is weak compared with the $O_2$ gas, etc., and the gas containing nitrogen (the gas containing nitrogen and oxygen) can be used together with oxygen. By using such a gas, the silicon nitride layer can be changed to the silicon oxynitride layer while allowing the nitrogen to be remained in the silicon nitride layer.

[Step 6]

After the silicon nitride layer is changed to the silicon oxynitride layer, the valve 243c of the third gas supply tube 232c is closed, to thereby stop the supply of the $N_2O$ gas. At this time, the valve 244 of the exhaust tube 231 is left opened, to thereby vacuum-exhaust the inside of the processing chamber 201, and remove the unreacted $N_2O$ gas or the $N_2O$ gas after contributing to the formation of the silicon oxynitride layer or reaction byproducts remained in the processing chamber 201. At this time, the valves 243d, 243e, 243f are left opened, to thereby maintain the supply of the $N_2$ gas into the processing chamber 201 as the inert gas. The $N_2$ gas actions as the purge gas, thus further enhancing the effect of removing the unreacted $N_2O$ gas or the $N_2O$ gas after contributing to the formation of the silicon oxynitride layer remained in the processing chamber 201 (removal of the remained gas). At this time, the gas remained in the processing chamber 201 is not required to be completely removed, and the inside of the processing chamber 201 may not be completely purged. In a case of the slight amount of the gas remained in the processing chamber 201, the adverse influence is not generated in step 1 performed thereafter. At this time, the flow rate of the $N_2$ gas supplied into the processing chamber 201, is not required to be large, and for example, by supplying the same amount of the flow rate as the volume of the processing tube 203 (processing chamber 201), purge of not generating the adverse influence can be performed in step 1. Thus, by not completely purging the inside of the processing chamber 201, the purging time can be shortened, and the throughput can be improved. Further, the consumption of the $N_2$ gas can be suppressed to a necessary minimum.

The temperature of the heater 207 at this time, is set so that the temperature of the wafer 200 is the temperature in the range of 350 to 950° C., preferably 700 to 950° C., more preferably 750 to 950° C., and further preferably 800 to 950° C., similarly to the case of supplying the $N_2O$ gas. The supply flow rate of the $N_2$ gas as the purge gas, is set to the flow rate in the range of 200 to 1000 sccm (0.2 to 1 slm). As described above, the volume flow rate of the $N_2$ gas as the purge gas is not required to be large as the volume flow rate of the $N_2$ gas as the deposition/adsorption inhibiting gas, and a sufficient purging effect can be obtained by the smaller flow rate than the volume flow rate of the $N_2$ gas. As the purge gas, rare gases such as Ar gas, He gas, Ne gas, and Xe gas, etc., may be used other than the $N_2$ gas.

The above-mentioned steps 1 to 6 are set as one cycle, and by performing this cycle at least one or preferably multiple numbers of times, the silicon oxynitride film (SiON film) having a specific film thickness can be formed on the wafer 200.

(Purge and Return to Atmospheric Pressure)

When the silicon oxynitride film having the specific film thickness is formed, the valves 243d, 243e, 243f are opened, to thereby supply the $N_2$ gas into the processing chamber 201 as the inert gas from each of the first inert gas supply tube 232d, the second inert gas supply tube 232e, and the third inert gas supply tube 232f, and is exhausted from the exhaust tube 231. The $N_2$ gas actions as the purge gas, thus purging the inside of the processing chamber 201 by the inert gas, and removing the gas or the reaction byproduct remained in the processing chamber 201 (purge) from the processing chamber 201. Thereafter, the atmosphere in the processing chamber 201 is replaced by the inert gas, and the pressure in the processing chamber 201 is returned to a normal pressure (return to atmospheric pressure).

(Boat Unload and Wafer Discharge)

Thereafter, the seal cap 219 is descended by the boat elevator 115, and the lower end of the reaction tube 203 is opened, and the processed wafers 200 are unloaded to outside of the reaction tube 203 from the lower end of the reaction tube 203 in a state of being held by the boat 217. Thereafter, the processed wafers 200 are discharged from the boat 217 (wafer discharge).

(3) Effect of this Embodiment

According to this embodiment, one or a plurality of effects described below can be exhibited.

According to step 1 of this embodiment, by supplying the large flow rate of the $N_2$ gas as the deposition/adsorption inhibiting gas from the first nozzle 233a together with the HCD gas, into the processing chamber 201, the flow velocity of the HCD gas, particularly the flow velocity of the HCD gas sprayed toward the wafer 200 from the gas supply holes 248a of the first nozzle 233a and flowing in parallel to the surface of the wafer 200 (crossing the surface of the wafer 200), can be made fast. Thus, the efficiency of depositing silicon on the wafer 200 and the efficiency of making the HCD gas adsorbed on the wafer 200 can be reduced, and the silicon-containing layer can be formed on the wafer 200 while suppressing the deposition of silicon or adsorption of the HCD gas on the wafer 200. By the action of the deposition/adsorption inhibiting gas, the deposition or the adsorption center of the silicon-containing layer can be moved closer to the center from the edge side of the wafer 200, and the difference can be narrowed between the thickest portion and the thinnest portion of the silicon-containing layer, thus making it possible to uniformly form the silicon-containing layer even in the area where the adsorption reaction collapses in the high temperature zone of 700° C. or more for example, namely in the area where the deposition or the adsorption of the silicon-containing layer occurs excessively. As a result, the uniformity of the film thickens in the wafer plane of the silicon oxynitride film can be improved.

Further, in step 3 of this embodiment, by changing the silicon-containing layer to the silicon nitride layer using the nitriding species obtained by activating or thermally decomposing the $NH_3$ gas in the heated and depressurized atmosphere, energy of the nitriding species cuts not only the Si—H bond but also the N—H bond which requires a higher bonding energy than the Si—H bond, to thereby remove and discharge H (hydrogen) as $H_2$, etc. Si and N after cutting from the bond of Si—H and Si—N, are bonded to N and Si respectively, to thereby form a new Si—N bond. It is found that the silicon nitride layer formed in step 1 to step 4 of this embodiment, has less hydrogen concentration in the film by 1 digit than the hydrogen concentration of CVD-SiN layer, and is an extremely excellent film.

Further, it is also found that the uniformity of the film thickness in the wafer plane is more excellent than the case of forming the silicon nitride layer by a general CVD method, when the silicon nitride layer is formed in step 1 to step 4 of this embodiment. The general CVD method means the method of forming the silicon nitride layer by the CVD method by simultaneously supplying DCS and $NH_3$ being inorganic sources. It is also found that the concentration of impurities of hydrogen, etc., in the silicon nitride layer formed in step 1 to step 4 of this embodiment, is extremely lower than that of the silicon nitride layer formed by the general CVD method. It is also found that the hydrogen concentration in the silicon nitride layer formed in step 1 to step 4 of this embodiment, is extremely lower than that of the silicon nitride layer formed by the CVD method using the organic silicon source. Further, according to step 1 to step 4 of this embodiment, it is also found that even in a case of using the organic silicon source, an excellent uniformity is obtained in the layer thickness in the wafer plane and an excellent hydrogen concentration in the layer.

Further, in step 5 of this embodiment, the oxygen-containing gas is supplied to the silicon nitride layer formed in step 1 to step 4, and the silicon nitride layer is changed to the silicon oxynitride layer. The defect in the silicon nitride layer can be reduced by introducing oxygen into the silicon nitride layer. The silicon nitride layer formed in step 1 to step 4 has excellent characteristic of having less defects originally. However, by further executing step 5, oxygen is supplied to the defect caused by the loss of nitrogen and strain in the silicon nitride layer, so that the defect can be further reduced. As a result, a silicon oxynitride film with less defects (namely trap site of the electric charge), and high resistance to a stress voltage, can be obtained. Further, an insulating film with a large actual film thickness even in a case of the same EOT, can be formed. When the silicon oxynitride film obtained by the film formation sequence of this embodiment is used as a gate insulating film of a MOS capacitor for example, capture of the electric charge in the gate insulating film can be more effectively suppressed, and a shift of a flat band voltage and a change of a threshold value voltage can be more surely avoided.

Further, in step 5 of this embodiment, the nitrous oxide ($N_2O$) gas being a nitrogen oxide-based gas with relatively weak oxidizing power compared with the $O_2$ gas, etc., is used as the oxygen-containing gas. Thus, the silicon nitride layer can be changed to the silicon oxynitride layer while allowing the nitrogen in the silicon nitride layer to be remained. Namely, by using the $N_2O$ gas with weak oxidizing power, the defect can be more effectively reduced while avoiding the new generation of the loss of nitrogen. As a result, the resistance of the silicon oxynitride film to the stress voltage can be further increased.

Further, according to the film formation sequence of this embodiment, the silicon oxynitride film with extremely low hydrogen concentration (also called a hydrogen-free SiON film hereafter) can be formed, and if the hydrogen-free SiON film is used as SAC (Self Aligned Contact), NBTI (Negative Bias Temperature Instability) characteristic can be improved.

Further, if the hydrogen-free SiON film is used as the gate insulating film, dielectric breakdown resistance can be increased. The Si—H bond is weak in a bonding force compared with the Si—N bond and the Si—O bond, and there is a high probability of desorption by re-bond of hole-electron. Si-unbonded hand (dangling bond) from which hydrogen is cut, becomes an electric charge trap, thus contributing to a current conduction and weakening the dielectric breakdown resistance. Therefore, high dielectric breakdown resistance can be obtained by using the hydrogen-free SiON film without hydrogen (particularly Si—H bond) in the film, namely by using the hydrogen-free SiON film with extremely less hydrogen in the film.

Further, according to the film formation sequence of this embodiment, the silicon oxynitride film with extremely low stress (also called a stress-free SiON film hereafter) can be formed, and by using the stress-free SiON film in STI (Shallow Trench Isolation) step, the following merit can be obtained. Namely, in Si-etching performed for forming STI with the SiN film as a mask, the SiN film is usually formed on a sacrifice oxide film having a film thickness of about 10 nm formed on the wafer, because damage such as a defect is generated in the wafer (channel portion) by directly forming the SiN film on the wafer due to high stress of the SiN film. Meanwhile, by using the stress-free SiON film in STI step, the damage is not generated in the wafer (channel portion) even if the stress-free SiON film is directly formed on the wafer, and therefore there is no necessity for forming the sacrifice oxide film, and two steps of forming the sacrifice oxide film and removing the sacrifice oxide film, can be omitted. Further, the SiN film after mask processing is in a state of receiving a large stress only on a backside of the wafer, thus straining the whole body of the wafer. However, by using the stress-free SiON film as the mask, the strain of the wafer is eliminated after mask processing, realizing a uniform touch of polishing, and a more efficient polishing is realized.

Other Embodiment of the Present Invention

In the above-mentioned embodiment, explanation is given for an example of improving the uniformity of the film thickness by increasing the flow velocity of the HCD gas flowing in parallel to the surface of the wafer 200 by the action of the deposition/adsorption inhibiting gas, so that the deposition of the silicon on the wafer 200 or the adsorption of the HCD gas on the wafer 200 is suppressed. However, the method of increasing the flow velocity of the HCD gas is not limited thereto.

For example, by setting a flow resistance inside of the reaction tube 203 to the same as the flow resistance between the wafers 200, the flow velocity of the HCD gas flowing in parallel to the surface of the wafer 200 can be increased. For example, by filling the space in the upper part and the lower part of the reaction tube 203 with a dummy wafer or a heat insulating board, the flow velocity of the HCD gas flowing in parallel to the surface of the wafer 200 can be increased, and the deposition of the silicon on the wafer 200 and the adsorption of the HCD gas on the wafer 200 can be suppressed, and the uniformity of the film thickness can be improved.

Further for example, by setting a conductance between the first nozzle 233a of supplying the HCD gas and the wafer 200, to the same as the conductance between the wafers 200, the flow velocity of the HCD gas flowing in parallel to the surface of the wafer 200 can be increased. For example, by setting a diameter of the first nozzle 233a to be large or setting the diameter of the reaction tube 203 to be small, the flow velocity of the HCD gas flowing in parallel to the surface of the wafer 200 can be increased, and the deposition of the silicon on the wafer 200 or the adsorption of the HCD gas on the wafer 200 can be suppressed, and the uniformity of the film thickness can be improved.

Further for example, by repeating the supply and the exhaust of the HCD gas, the flow velocity of the HCD gas flowing in parallel to the surface of the wafer 200 can be increased. For example, by expanding a pressure difference between a wafer arrangement region in the reaction tube 203 and inside of the first nozzle 233a (inside of the buffer chamber 237), the flow velocity of the HCD gas flowing in parallel to the surface of the wafer 200 can be increased, and the deposition of the silicon on the wafer 200 and the adsorption of the HCD gas on the wafer 200 can be suppressed, and the uniformity of the film thickness can be improved.

Further in the above-mentioned embodiment, explanation is given for an example of forming the silicon oxynitride film having the specific film thickness on the wafer 200 by performing steps 1 to 6 sequentially in this order, and setting these steps as one cycle, and performing this cycle at least once or preferably multiple numbers of times. However, steps 1, 3, 5 may be replaced each other. Namely, the silicon oxynitride film having the specific film thickness can also be formed on the wafer 200 by sequentially performing steps 3, 4, 1, 2, 5, 6 in this order, and setting these steps as one cycle, and performing this cycle at least once or preferably multiple numbers of times. Further for example, the silicon oxynitride film having the specific film thickness can also be formed on the wafer 200 by performing steps 5, 6, 1, 2, 3, 4 sequentially in this order, and setting these steps as one cycle, and performing this cycle at least once or preferably multiple numbers of times. Further for example, the silicon oxynitride film having the specific film thickness can also be formed on the wafer 200 by performing steps 5, 6, 3, 4, 1, 2 sequentially in this order, and setting these steps as one cycle, and performing this cycle at least once or preferably multiple numbers of times.

Further in the above-mentioned embodiment, explanation is given for an example of forming on the substrate the silicon oxynitride film (SiON film) containing silicon (Si) being a semiconductor element as the oxynitride film. However, the present invention can also be applied to a case of forming a metal oxynitride film containing a metal element such as titanium (Ti), tantalum (Ta), and aluminum (Al), on the substrate as the oxynitride film. In this case, the metal oxynitride film having a specific film thickness is formed on the substrate by performing a cycle of: forming a metal element-containing layer on the substrate by supplying the source gas and the deposition/adsorption inhibiting gas (step 1); removing the remained gas by purge (step 2); changing the metal element-containing layer to a metal nitride layer by supplying the nitrogen-containing gas (step 3); removing the remained gas by purge (step 4); changing the metal nitride layer to the metal oxynitride layer by supplying the oxygen-containing gas (step 5), and removing the remained gas by purge (step 6), with this cycle as one cycle, and performing this cycle the specific number of times, For example, when a titanium oxynitride film (TiON film) is formed on the substrate as the metal oxynitride film containing titanium (Ti), the titanium oxynitride film having a specific film thickness is formed on the substrate by performing a cycle of: forming a titanium-containing layer on the substrate by supplying the source gas and the deposition/adsorption inhibiting gas (step 1); removing the remained gas by purge (step 2); changing the titanium-containing layer to a titanium nitride layer by supplying the nitrogen-containing gas (step 3); removing the remained gas by purge (step 4); changing the titanium nitride layer to a titanium oxynitride layer by supplying the oxygen-containing gas (step 5); and removing the remained gas by purge (step 6), with this cycle as one cycle, and performing this cycle the specific number of times. As the source gas, for example, $TiCl_4$ (titanium tetrachloride) gas or TDMAT (Tetrakis (dimethylamino)titanium: $Ti[N(CH_3)_2]_4$) gas can be used. As the nitrogen-containing gas, similarly to the above-mentioned embodiment, for example the $NH_3$ gas can be used. As the oxygen-containing gas, similarly to the above-mentioned embodiment, for example the N₂O gas can be used. In this case, the first gas supply system (source gas supply system) of the substrate processing apparatus of the above-embodiment is configured as a titanium-containing gas supply system. Further, the condition in a range of the processing condition described in the above-mentioned embodiment for example, is used as the processing condition. The TiON film is a conductive metal oxynitride film.

Further for example, when a tantalum oxynitride film (TaON film) is formed on the substrate as the metal oxynitride film containing tantalum (Ta), the tantalum oxynitride film having a specific film thickness is formed on the substrate by performing a cycle of: forming a tantalum-containing layer on the substrate by supplying the source gas and the deposition/adsorption inhibiting gas (step 1); removing the remained gas by purge (step 2); changing the tantalum-containing layer to a tantalum nitride layer by supplying the nitrogen-containing gas (step 3); removing the remained gas by purge (step 4); changing the tantalum-nitride layer to a tantalum oxynitride layer by supplying the oxygen-containing gas (step 5); and removing the remained gas by purge (step 6), with this cycle as one cycle, and performing this cycle the specific number of times. As the source gas, for example PET (Penta ethoxy tantalum:Ta(OC₂H₅)₅) gas can be used. As the nitrogen-containing gas, similarly to the above-mentioned embodiment, for example, the NH₃ gas can be used. As the oxygen-containing gas, similarly to the above-mentioned embodiment, for example the N₂O gas can be used. In this case, the first gas supply system (source gas supply system) of the substrate processing apparatus in the above-mentioned embodiment, is configured as a tantalum-containing gas supply system. Further, the condition in the range of the processing condition described in the above-mentioned embodiment is used as the processing condition. The TaON film is the conductive metal oxynitride film.

Further for example, when an aluminum oxynitride film (AlON film) is formed on the substrate as the metal oxynitride film containing aluminum (Al), the aluminum oxynitride film having a specific film thickness is formed on the substrate by performing a cycle of: forming an aluminum-containing layer on the substrate by supplying the source gas and the deposition/adsorption inhibiting gas (step 1); removing the remained gas by purge (step 2); changing the aluminum-containing layer to an aluminum nitride layer by supplying the nitrogen-containing gas (step 3); removing the remained gas by purge (step 4); changing the aluminum nitride layer to an aluminum oxynitride layer by supplying the oxygen-containing gas (step 5); and removing the remained gas by purge (step 6), with this cycle as one cycle, and performing this cycle the specific number of times. As the source gas, for example TMA (Trimethyl-aluminium:Al(CH₃)₃) gas can be used. As the nitrogen-containing gas, similarly to the above-mentioned embodiment, for example, the NH₃ gas can be used. As the oxygen-containing gas, similarly to the above-mentioned embodiment, for example the N₂O gas can be used. In this case, the first gas supply system (source gas supply system) of the substrate processing apparatus in the above-mentioned embodiment, is configured as an aluminum-containing gas supply system. Further, the condition in the range of the processing condition described in the above-mentioned embodiment is used as the processing condition. The AlON film is an insulating metal oxynitride film.

Thus, the film formation sequence of this embodiment can be applied to: forming the conductive metal oxynitride film such as TiON film and TaON film, etc., and forming the insulating metal oxynitride film such as AlON film, etc. Namely, the film formation sequence of this embodiment can be applied not only to a case that the specific element is the semiconductor element, but also to a case that the specific element is the metal element. Thus, even in a case that the present invention is applied to the formation of the metal oxynitride film, the effect similar to the case of applying the present invention to the formation of the silicon oxynitride film, can be obtained.

Further, in the above-mentioned embodiment, explanation is given for an example of forming a film using the batch-type substrate processing apparatus for processing a plurality of substrates at once. However, the present invention is not limited thereto, and can be suitably applied to a case that one or a plurality of substrates are processed at once using a single wafer type substrate processing apparatus.

Further, modified examples or application examples, etc., of the above-mentioned embodiment can be used suitably in combination.

Further, the present invention can also be realized by changing the process recipe of the existing substrate processing apparatus. When the process recipe is changed, it is also acceptable that the process recipe of the present invention is installed on the existing substrate processing apparatus via an electric communication line or a recording medium in which such a process recipe is recorded, or the process recipe itself is changed to the process recipe of the present invention by operating the input/output device of the existing substrate processing apparatus.

EXAMPLES

First Example

Next, a first example will be described.

The SiN film was formed on the wafer by repeating the cycle of steps 1 to 4 in the film formation sequence of the above-mentioned embodiment as one cycle, and the film thickness and the uniformity of the film thickness in the wafer plane was measured. A film formation temperature (wafer temperature) was set to the temperature in a range of 800 to 950° C. where the uniformity of the film thickness was deteriorated remarkably. The supply flow rate of the N₂ gas as the deposition/adsorption inhibiting gas is varied in three ways in a range of 2 to 8 slm. Such three ways of the supply flow rate of the N₂ gas was expressed by a ratio of (A) 2.5, (B) 5.0, (C) 7.5, with a certain flow rate value as a reference, namely, 1, each of them called flow rate condition (A), flow rate condition (B), and flow rate condition (C), respectively. The condition in the range of the processing condition described in the above-mentioned embodiment is used as the other film formation condition (processing condition in each step). Results thereof are shown in FIG. 8 and FIG. 9.

Figure 8:
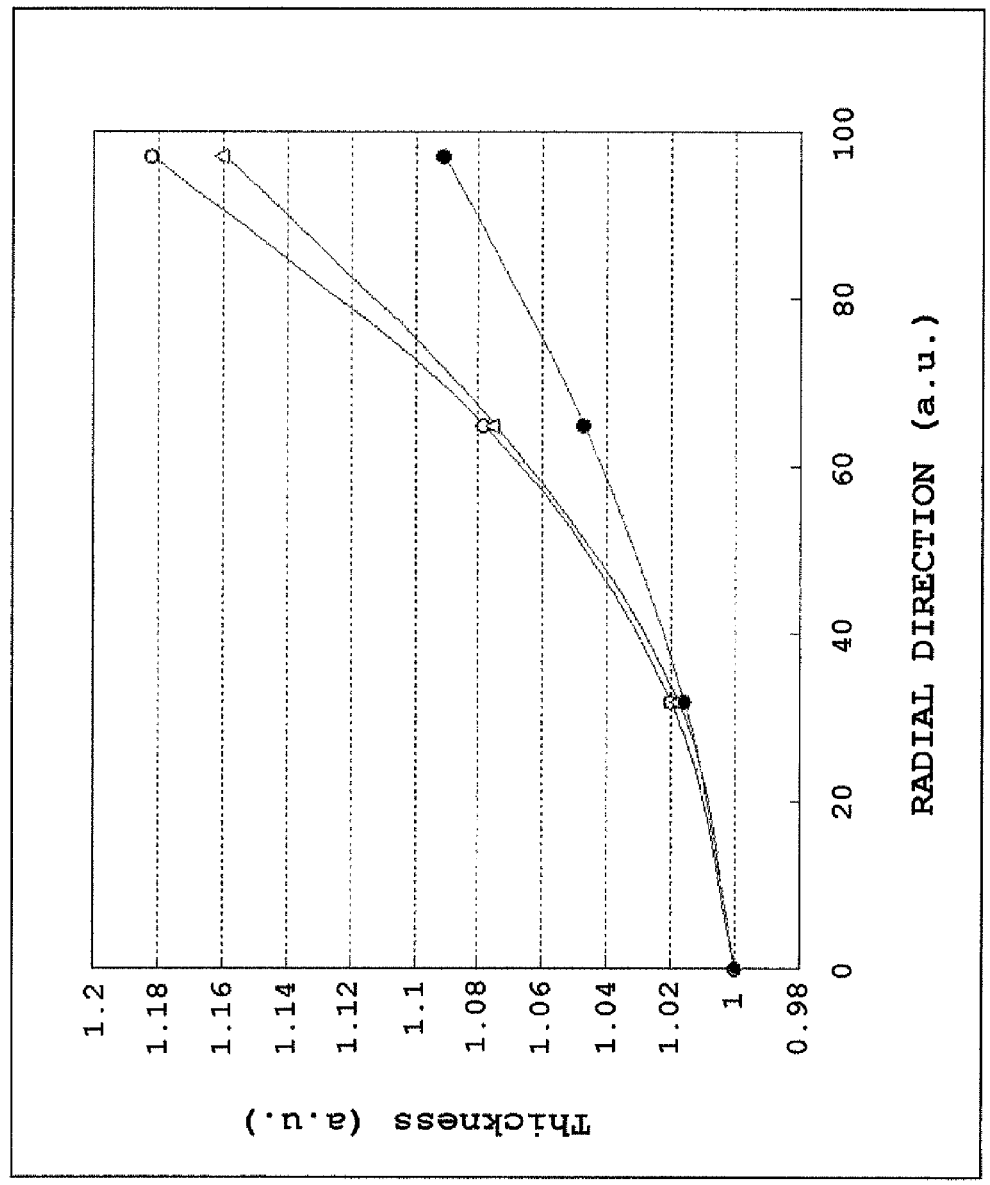
FIG. 8 is a view showing a dependency of a film thickness of a SiN film on a distance from a center of a wafer, by a difference in supply flow rate of the deposition/adsorption inhibiting gas ($N_2$) in a first example.

FIG. 8 is a view showing a dependency of the film thickness of the SiN film, on the distance from the wafer center, depending on a difference in the supply flow rate of the deposition/adsorption inhibiting gas (N₂). The horizontal axis of FIG. 8 indicates the distance (arbitrary unit (a.u.)) from the wafer center in the wafer plane, namely indicate a position toward a wafer edge direction (radial direction) from the wafer center. Zero of the horizontal axis indicates a wafer center position, and 100 indicates a wafer edge position. The vertical axis of FI. 8 indicates the film thickness (a.u.) of the SiN film. The film thickness is indicated by a ratio, with a film thickness value at the wafer center as a reference, namely 1. White circles (○), white triangles (Δ), and black circles (●) respectively indicates the film thickness in a case of setting the flow rate of the deposition/adsorption inhibiting gas (N₂) as flow rate condition (A), flow rate condition (B), and flow rate condition (C).

From FIG. 8, it is found that as the supply flow rate of the N₂ gas as the deposition/adsorption inhibiting gas becomes larger, the film thickness on the outer periphery of the wafer becomes small, and a thick portion of the film thickness is moved in a wafer center direction. Further, the difference of the film thickness can be made small between the thickest portion and the thinnest portion of the SiN film. Namely, it is found that as the flow rate of the $N_2$ gas becomes larger, a deposition center of the silicon or an adsorption center of the HCD gas can be moved closer to the center from the edge side of the wafer, and the silicon-containing layer can be uniformly formed, and as a result, the SiN film can be uniformly formed.

Figure 9:
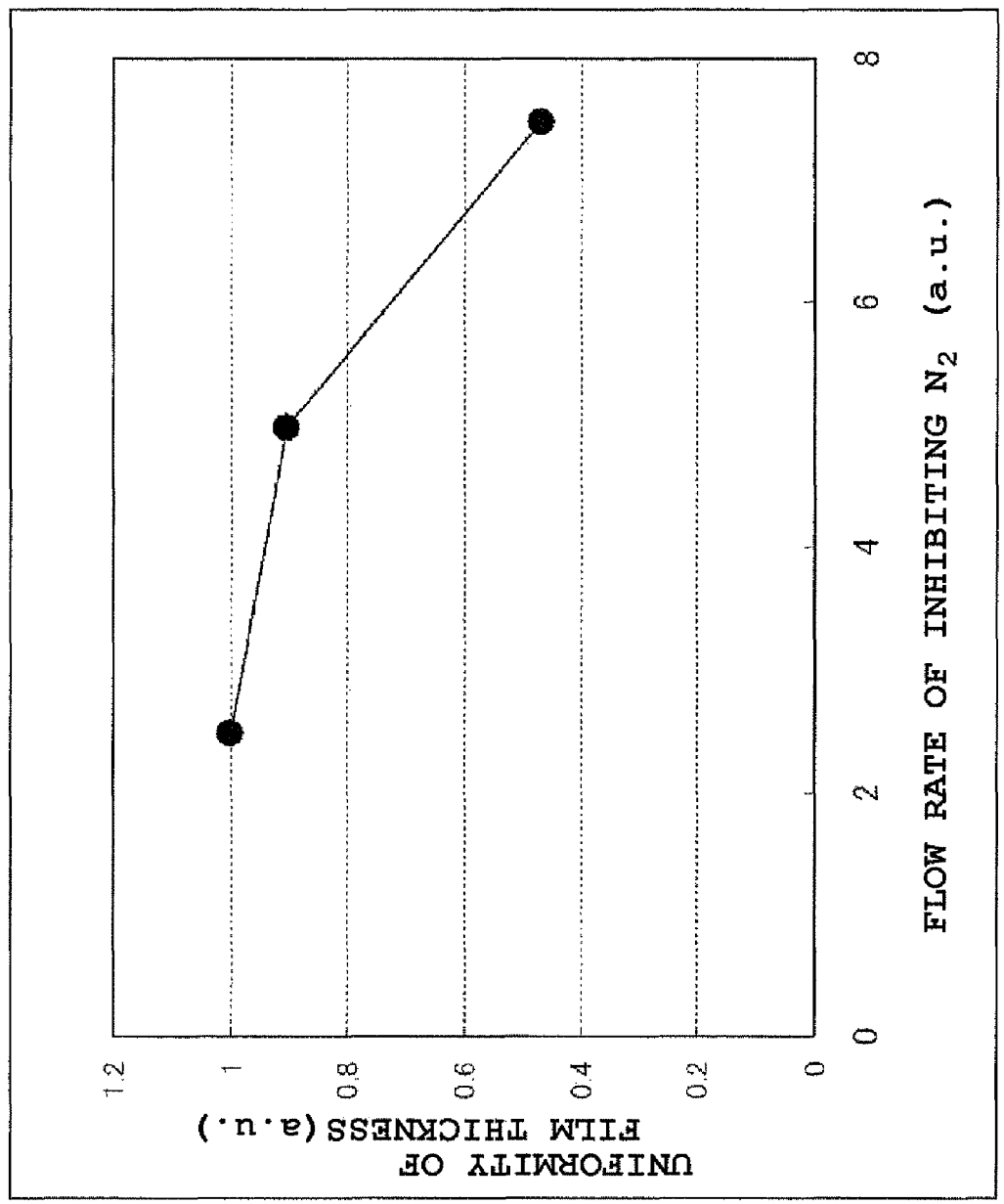
FIG. 9 is a view showing a dependency of the SiN film on the supply flow rate of the deposition/adsorption inhibiting gas ($N_2$) with uniformity of the film thickness in a wafer plane of the SiN film in the first example.

FIG. 9 is a view showing the dependency of the uniformity of the film thickness in the wafer plane of the SiN film, on the supply flow rate of the deposition/adsorption inhibiting gas ($N_2$). The horizontal axis of FIG. 9 indicates the supply flow rate (a.u.) of the deposition/adsorption inhibiting gas ($N_2$). As described above, the supply flow rate of the $N_2$ gas is expressed by the ratio, with a certain flow rate value as a reference, namely 1. The vertical axis of FIG. 9 indicates the uniformity (a.u.) of the film thickness in the wafer plane. The uniformity of the film thickness in the wafer plane is expressed by the ratio, with the uniformity of the film thickness in the wafer plane as a reference, namely 1, when the flow rate condition (A) is used for the supply flow rate of the deposition/adsorption inhibiting gas ($N_2$). Black circles (●) of FIG. 9 indicate the uniformity of the film thickness in the wafer plane of the SiN film when the flow rate condition (A), the flow rate condition (B), and the flow rate condition (C) are used for the supply flow rate of the deposition/adsorption inhibiting gas ($N_2$) sequentially from the left side. The uniformity of the film thickness in the wafer plane show a degree of a variation in a film thickness distribution in the wafer plane, and as the value becomes smaller, excellent uniformity of the film thickness in the wafer plane is shown.

From FIG. 9, it is found that as the supply flow rate of the $N_2$ gas becomes larger as the deposition/adsorption inhibiting gas, the uniformity of the film thickness in the wafer plane of the SiN film is improved. It is also found that even in any case of the flow rate condition (A), the flow rate condition (B), and the flow rate condition (C) for the supply flow rate of the deposition/adsorption inhibiting gas ($N_2$), the uniformity of the film thickness in the wafer plane of the SiN film is about 10% or less, and the uniformity of the film thickness in the wafer plane of the SiN film is about 5% or less under the flow rate condition (C), and even in a high temperature region of 800 to 950° C. where the uniformity of the film thickness is remarkably deteriorated, the SiN film with extremely excellent uniformity of the film thickness in the wafer plane, can be formed.

Further under a similar condition as this example, the SiON film was formed on the wafer by repeating a cycle of steps 1 to 6 in the film formation sequence of the above-mentioned embodiment, with this cycle as one cycle, and regarding this SiON film as well, it was confirmed that the uniformity of the film thickness on the wafer plane, which was similar to the uniformity of the film thickness of the SiN film of this example, could be obtained.

Second Example

Next, explanation is given for a second example.

The SiN film was formed on the wafer by repeating a cycle of steps 1 to 4 in the film formation sequence of the above-mentioned embodiment, with this sequence as one cycle, and a hydrogen concentration and a film density of the formed SiN film were measured. The film formation temperature (wafer temperature) was varied in three ways in a range of 600° C. to 900° C. The supply flow rate of the $N_2$ gas as the deposition/adsorption inhibiting gas was set to a certain flow rate in a range of 2 to 8 slm. The condition in the range of the processing condition described in the above-mentioned embodiment, was used as the other processing condition (processing condition in each step). Further, the hydrogen concentration of the SiN film was measured by TDS (Thermal Desorption Spectroscopy), and the film density was measured by SRP (X-ray Reflection). Results thereof are shown in FIG. 10 and FIG. 11.

Figure 10:
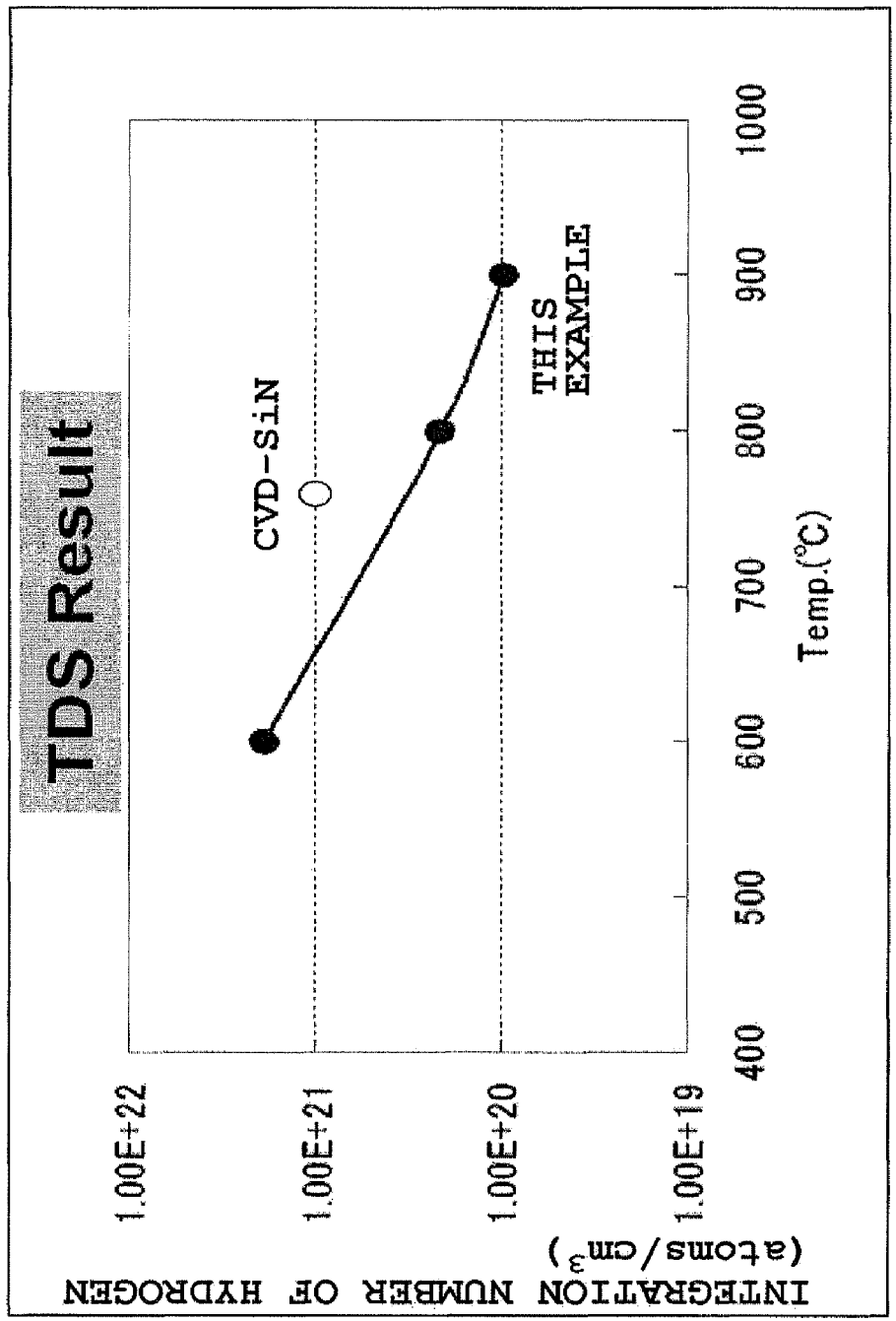
FIG. 10 is a view showing a relation between a film formation temperature of the SiN film and a hydrogen concentration in the SiN film in a second example.

FIG. 10 is a view showing a relation between the film formation temperature of the SiN film and the hydrogen concentration (desorbed hydrogen amount by TDS) according to this example. The horizontal axis of FIG. 10 indicates the film formation temperature (wafer temperature) (° C.), and the vertical axis of FIG. 10 indicates the hydrogen concentration (hydrogen integration number)(atoms/cm$^3$) in the SiN film. Black circles (●) in FIG. 10 indicate the hydrogen concentration in the SiN film when the film formation temperature is set to 600° C., 800° C., and 900° C. respectively. White circle (○) in FIG. 10 indicates the hydrogen concentration in the SiN (CVD-SiN film) formed by an ordinary CVD method using the $SiH_2Cl_2$ gas and the $NH_3$ gas in the temperature zone of 700° C. to 800° C.

From FIG. 10, it is found that the hydrogen concentration in the SiN film in this example is reduced as the film formation temperature becomes higher, and is lower than the hydrogen concentration in the CVD-SiN film of a comparative example, in the temperature zone of at least 700° C. to 800° C. or higher. It is also found that the hydrogen concentration in the SiN film in this example is $10^{20}$ order ($1.0 \times 10^{20}$ atoms/cm$^3$) compared with $10^{21}$ order ($1.0 \times 10^{21}$ atoms/cm$^3$) of the hydrogen concentration in the CVD-SiN film of the comparative example, and can be lower by one digit than the hydrogen concentration in the CVD-SiN film of the comparative example.

Figure 11:
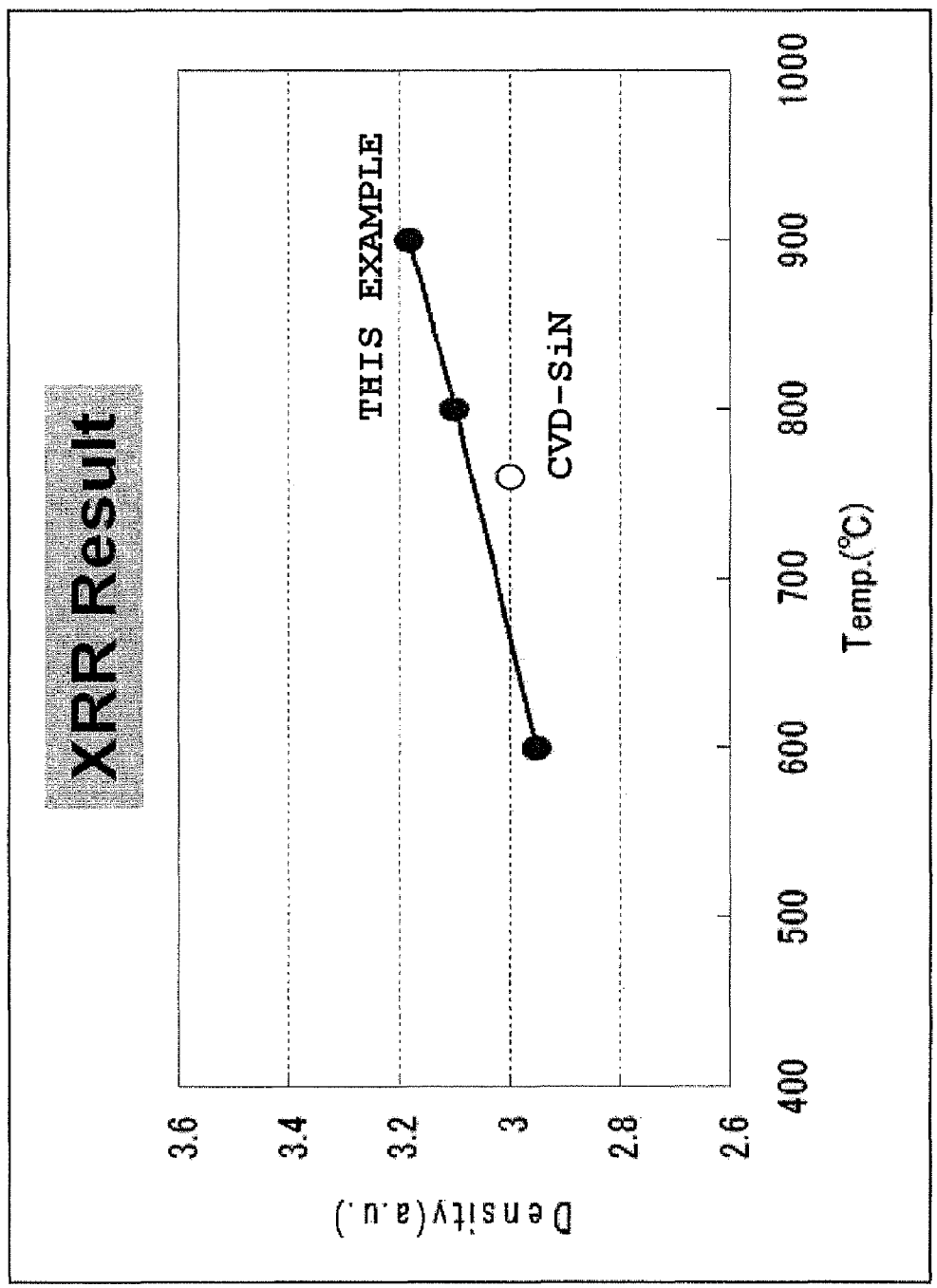
FIG. 11 is a view showing a relation between the film formation temperature of the SiN film and a film density of the SiN film in the second example.

FIG. 11 is a view showing a relation between the film formation temperature of the SiN film and the film density of the SiN film in this example. The horizontal axis of FIG. 11 indicates the film formation temperature (wafer temperature)(° C.), and the vertical axis indicates the film density (a.u.) of the SiN film. Black circles (●) of FIG. 11 indicate the film density of the SiN film when the film formation temperature is set to 600° C., 800° C., and 900° C. respectively. White circle (○) of FIG. 11 indicates the film density of the SiN film (CVD-SiN film formed by the ordinary CVD method using the $SiH_2Cl_2$ gas and the $NH_3$ gas in the temperature zone of 700° C. to 800° C. as the comparative example.

From FIG. 11, it is found that the film density of the SiN film in this example is high, as the film temperature becomes higher, and is higher than the film density of the CVD-SiN film in the comparative example in the temperature zone of at least 700° C. to 800° C. or higher.

Further, under the similar condition as this example, the SiON film was formed on the wafer by repeating a cycle of steps 1 to 6 in the film formation sequence of the above-mentioned embodiment, with this cycle as one cycle, and regarding this SiON film as well, it was confirmed that the hydrogen concentration and the film density similar to those of the SiN film of this example could be obtained.

Third Example

Next, a third example will be described.

The SiN film was formed on the wafer based on the film formation sequence of this embodiment in a case of using the deposition/adsorption inhibiting gas, and the film formation sequence of this embodiment in a case of not using the deposition/adsorption inhibiting gas, and the uniformity of the film thickness in the wafer plane of the SiN film was respectively measured. The SiN film was formed by repeating a cycle of steps 1 to 4 in the film formation sequence of the above-mentioned embodiment, with these steps as one cycle. The film formation temperature in the film formation sequence of this embodiment in the case of using the deposition/adsorption inhibiting gas was varied in a range of 800 to 900° C. The film formation temperature in the film formation sequence of this embodiment in the case of not using the deposition/adsorption inhibiting gas was varied in a range of 600 to 900° C. The condition in the range of the condition described in the above-mentioned embodiment was used as the other film formation condition (processing condition in each step).

Figure 12:
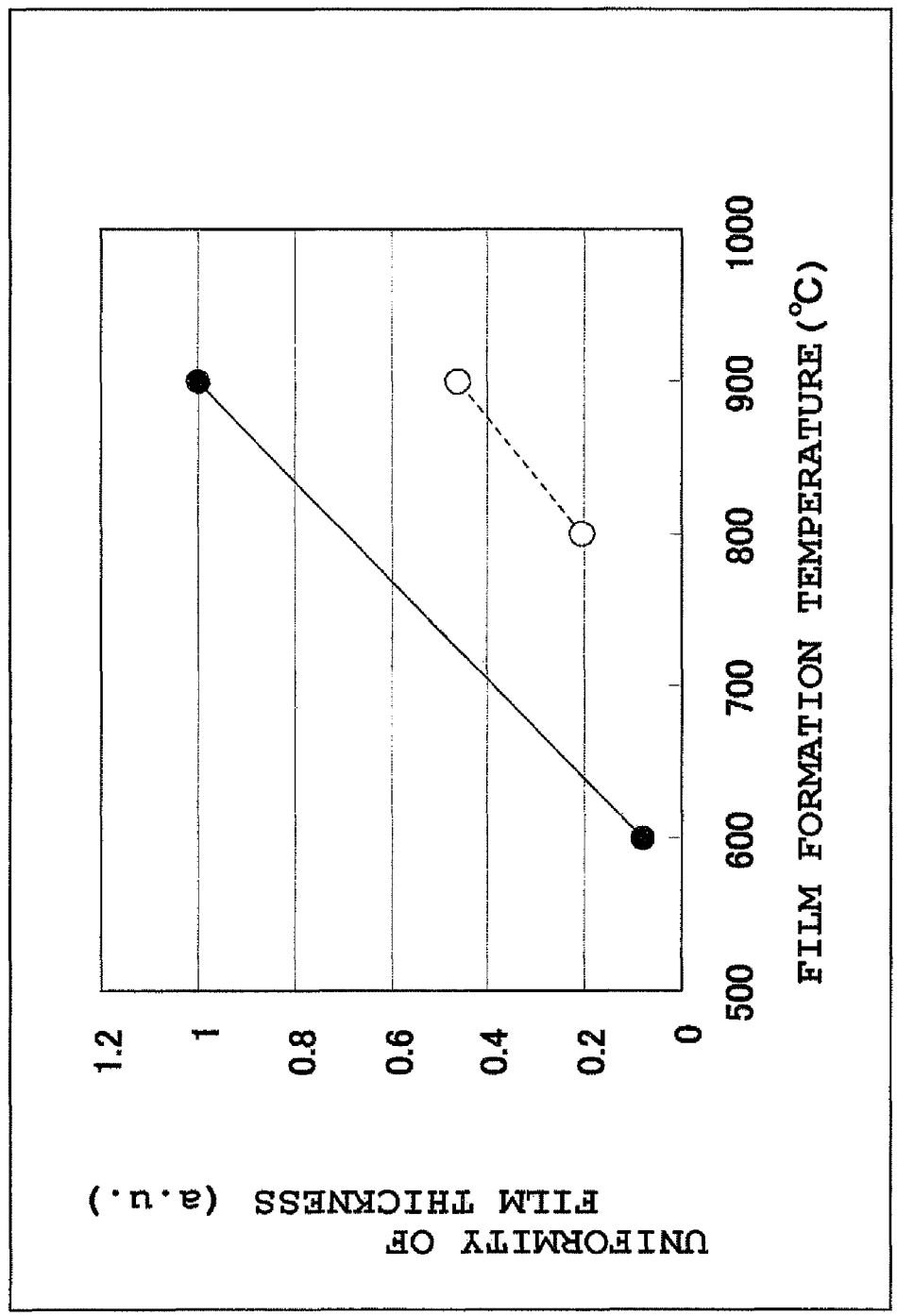
FIG. 12 is a view showing a relation between the film formation temperature of the SiN film and uniformity of the film thickness in a wafer plane in a third example.

Results thereof are shown in FIG. 12. FIG. 12 is a view showing the relation between the uniformity of the film thickness in the wafer plane and the film formation temperature (wafer temperature). The horizontal axis of FIG. 12 indicates the film formation temperature (° C.), and the vertical axis indicates the uniformity of the film thickness (arbitrary unit (a.u.)) in the wafer plane. The uniformity of the film thickness in the wafer plane is expressed by a ratio, with the uniformity of the film thickness in the wafer plane of the SiN film formed at a film formation temperature of 900° C. based on the film formation sequence of this embodiment in the case of not using the deposition/adsorption inhibiting gas as a reference, namely 1. Black circles (●) in FIG. 12 indicate the uniformity of the film thickness in the wafer plane of the SiN film formed based on the film formation sequence of this embodiment in the case of not using the deposition/adsorption inhibiting gas. Further, white circles (○) indicate the uniformity of the film thickness in the wafer plane of the SiN film formed based on the film formation sequence of this embodiment in the case of using the deposition/adsorption inhibiting gas. The uniformity of the film thickness in the wafer plane show the degree of the variation in the film thickness distribution in the wafer plane, and show that the uniformity of the film thickness in the wafer plane is excellent as the value of the variation becomes smaller.

From FIG. 12, it is found that the uniformity of the film thickness in the wafer plane of the SiN film formed based on the film formation sequence of this embodiment in the case of using the deposition/adsorption inhibiting gas, is more excellent than the uniformity of the film thickness in the wafer plane of the SiN film formed based on the film formation sequence of this embodiment in the case of not using the deposition/adsorption inhibiting gas. Particularly, when the film formation temperature is set at 800 to 900° C., it is found that the uniformity of the film thickness in the wafer plane of the SiN film formed based on the film formation sequence of this embodiment, is ½ or less of the uniformity of the film thickness in the wafer plane of the SiN film formed based on the film formation sequence of this embodiment in the case of not using the deposition/adsorption inhibiting gas. Namely, by forming the SiN film using the deposition/adsorption inhibiting gas based on the film formation sequence of this embodiment, the uniformity of the film thickness in the wafer plane can be considerably improved in the high temperature zone.

Further under the similar condition as this example, the SiON film was formed on the wafer by repeating a cycle of steps 1 to 6 in the film formation sequence of the above-mentioned embodiment, with this cycle as one cycle, and regarding this SiON film as well, it was confirmed that the uniformity of the film thickness on the wafer plane, which was similar to the uniformity of the film thickness of the SiN film of this example, could be obtained. Further, similarly to the SiN film of this example, it was confirmed that the uniformity of the film thickness in the wafer plane was considerably improved in the high temperature zone, by forming the SiON film using the deposition/adsorption inhibiting gas.

Fourth Example

Next, a fourth example will be described together with a reference example.

As the gate insulating film of the MOS capacitor, the SiON film was formed on the wafer (P-type silicon wafer) by repeating a cycle of steps 1 to 6 in the film formation sequence of the above-mentioned embodiment, with this cycle as one cycle. Then, a gate electrode made of a conductive film was further formed on the SiON film and an evaluation sample was created. Then, a bias voltage Vs was applied between the gate electrode and the wafer for a specific time as an electric stress added on the SiON film, and thereafter C-V (capacity-gate voltage) characteristic was measured. The wafer temperature in forming the SiON film was set to 900° C. The bias voltage Vs as the electric stress was set to −5V, and the application time was set in a range of 0 second to 500 seconds.

In the reference example, the SiN film was formed on the wafer by performing a cycle of: forming the silicon-containing layer on the wafer (P-type silicon wafer) by supplying the HCD gas; removing the remained gas by purge; changing the silicon-containing layer to the silicon nitride layer by supplying the $NH_3$ gas; and removing the remained gas by purge, with this cycle as one cycle and performing this cycle the specific number of times, and further an evaluation sample was created by forming the gate electrode made of the conductive film on the SiN film. Then, the bias voltage Vs was applied between the gate electrode and the wafer for the specific time, as the electric stress added on the SiN film, and thereafter the C-V (capacity-gate voltage) characteristic was measured. The wafer temperature in forming the SiN film was set to 800° C. The bias voltage Vs as the electric stress was set to −5V, and the application time was set in the range of 0 second to 500 seconds.

In order to obtain a constant stress added on each evaluation sample, EOT of the gate insulating film (SiON film, SiN film) in each evaluation sample, was set to a similar value. Specifically, EOT of the SiON film in the evaluation sample of the example was set to 4.3 nm, and EOT of the SiN film in the evaluation sample of the reference example was set to 4.4 nm.

Figure 13:
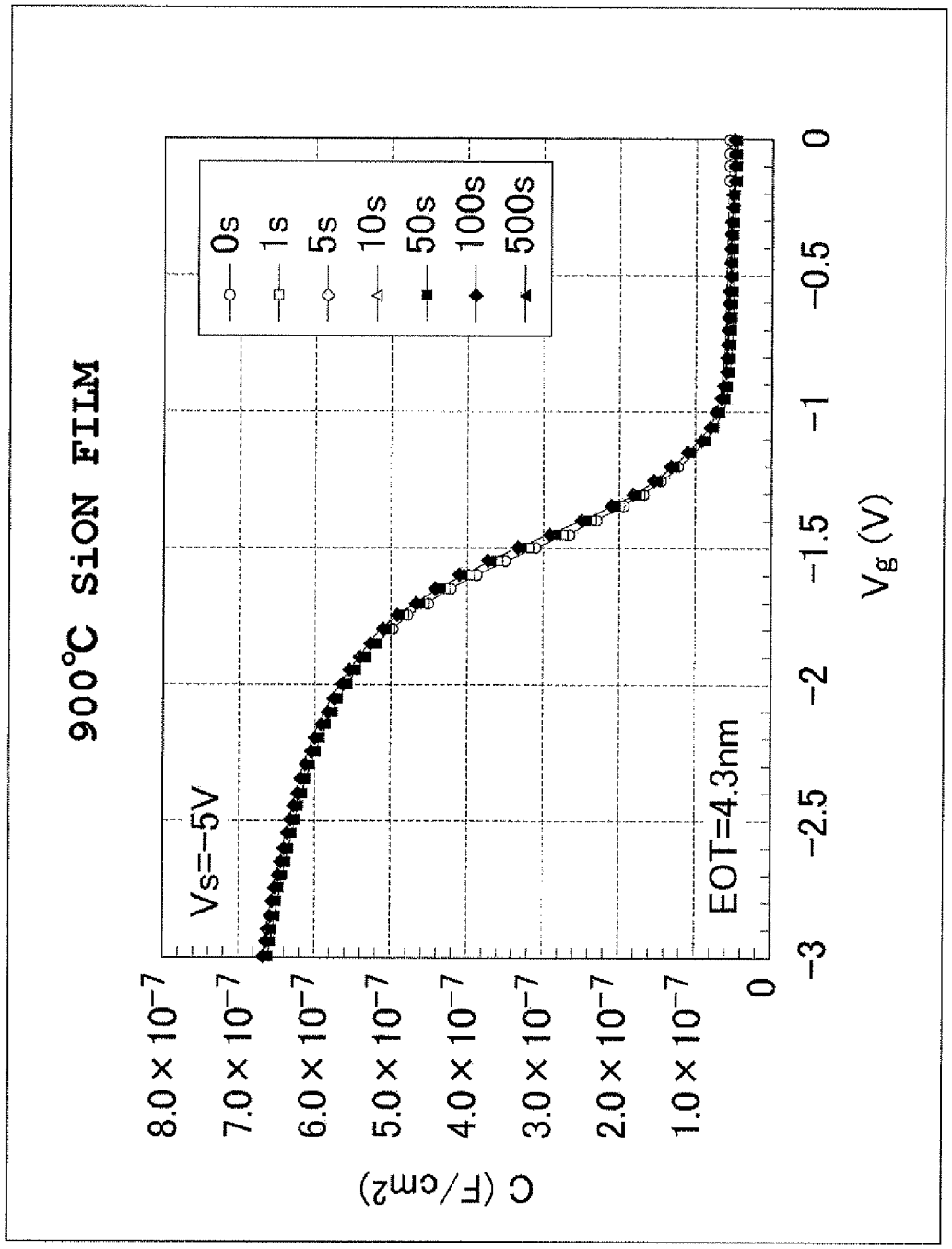
FIG. 13 is a view showing C-V characteristics of an evaluation sample using a SiON film in a fourth example.
Figure 14:
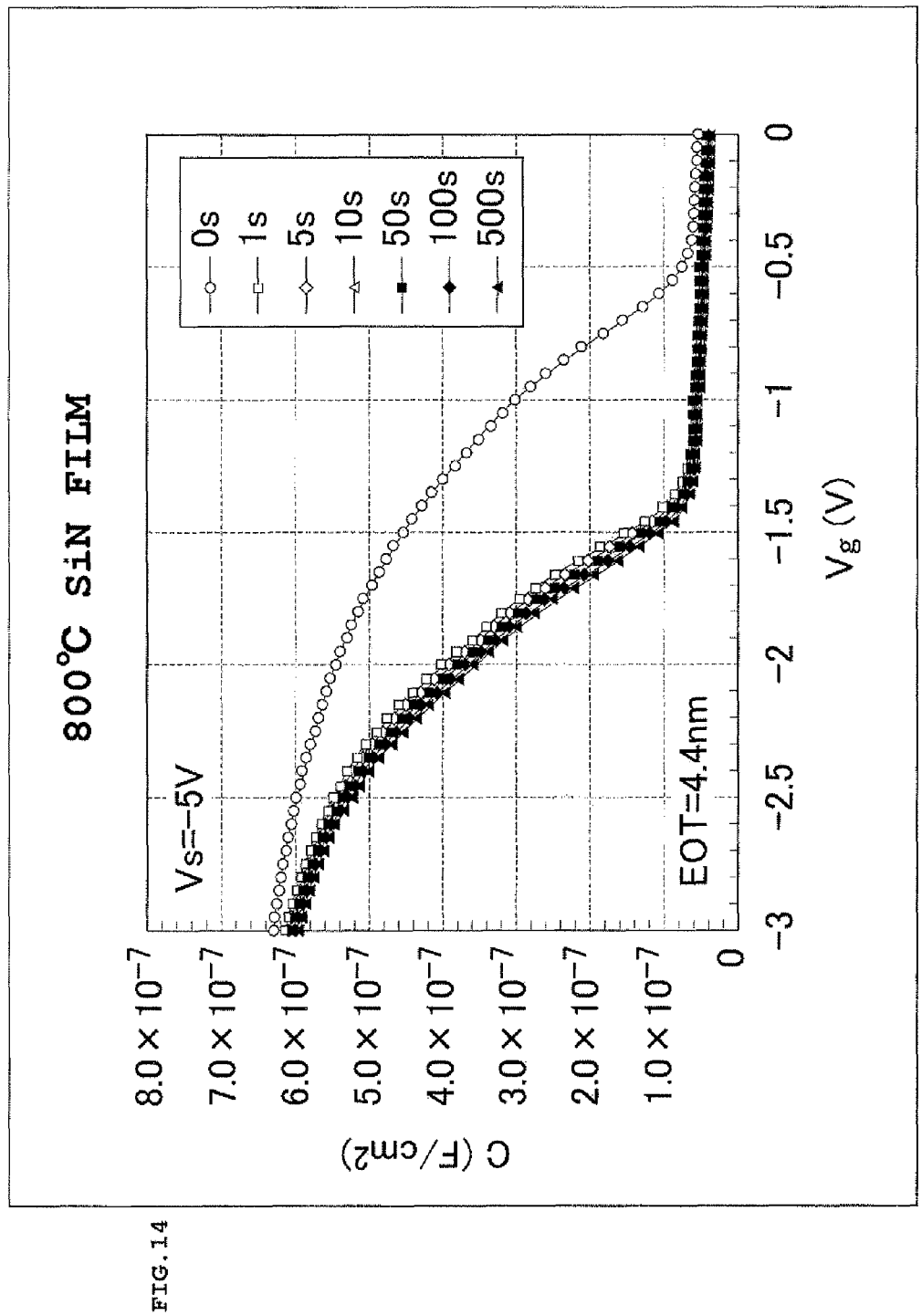
FIG. 14 is a view showing the C-V characteristics of the evaluation sample using the SiN film in a reference example.

FIG. 13 is a graph showing the C-V characteristic of the evaluation sample of the example, and FIG. 14 is a graph showing the C-V characteristic of the evaluation sample of the reference example. The horizontal axis of FIG. 13 and FIG. 14 indicates a gate voltage Vg (V) applied to the gate electrode when measuring the C-V characteristic, and the vertical axis indicates an electrostatic capacity C ($F/cm^2$) respectively. ○, □, △, ■, ♦, ▲ in FIG. 13 and FIG. 14 indicate measurement results obtained in a case of setting the application time of the bias voltage Vs to 0 seconds (without application), 1 second, 5 seconds, 10 seconds, 50 seconds, 100 seconds, and 500 seconds.

When FIG. 13 and FIG. 14 are compared, a shift point (gate voltage value) from a depletion layer to an accumulating layer is not fluctuated in the evaluation sample (FIG. 13) of the example, irrespective of presence/absence and an application time of the stress voltage. Namely, it is found that a flat band voltage is not shifted. It can be considered that this is because there are less defects (trap site of the electric charge) in the film, and the capture of the electric charge in the film can be suppressed in the SiON film of the example. Meanwhile, in the evaluation sample of the reference example (FIG. 14), it is found that the shift point (gate voltage value) from the depletion layer to the accumulating layer is fluctuated by application of the stress voltage Vs, namely it is found that the flat band voltage is shifted. It can be considered that this is because in the SiN film of the reference example, there are relatively a plurality of defects in the film (trap site of the electric charge), and there is a large amount of capture of the electric charge in the film.

Preferable Aspects of the Present Invention

Preferable aspects of the present invention will be supplementarily described hereafter.

(Supplementary Description 1)

According to an aspect of the present invention, there is provided a method of manufacturing a semiconductor device, including:

forming an oxynitride film having a specific film thickness on a substrate by alternately repeating:

forming a specific element-containing layer on the substrate by supplying a source gas containing a specific element to the substrate heated in a processing vessel, under a condition that a thermal decomposition reaction of the source gas is caused;

changing the specific element-containing layer to a nitride layer by supplying a nitrogen-containing gas to the substrate heated in the processing vessel under a pressure of less than atmospheric pressure; and changing the nitride layer to an oxynitride layer by supplying an oxygen-containing gas to the substrate heated in the processing vessel under a pressure of less than atmospheric pressure, interposing into the above sequences, purging of an inside of the processing vessel by supplying an inert gas into the processing vessel, wherein in forming the specific element-containing layer, the source gas is supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by supplying an inert gas or a hydrogen-containing gas to the substrate through the nozzle together with the source gas.

(Supplementary Description 2)

There is provided the method of the supplementary description 1, wherein in changing the nitride layer to the oxynitride layer, the nitride layer is oxidized without saturating an oxidation reaction of the nitride layer by the oxygen-containing gas.

(Supplementary Description 3)

There is provided the method of the supplementary description 1, wherein the oxygen-containing gas includes a nitrogen oxide-based gas.

(Supplementary Description 4)

There is provided the method of the supplementary description 1, wherein the oxygen-containing gas includes at least one of the gases selected from the group consisting of a $N_2O$ gas, a NO gas, and a $NO_2$ gas.

(Supplementary Description 5)

There is provided the method of the supplementary description 1, wherein the oxygen-containing gas includes a $N_2O$ gas.

(Supplementary Description 6)

There is provided the method of the supplementary description 1, wherein a temperature of the substrate in forming the oxynitride film having the specific film thickness, is set to 350° C. or more and 950° C. or less.

(Supplementary Description 7)

There is provided the method of the supplementary description 1, wherein a temperature of the substrate in forming the oxynitride film having the specific film thickness, is set to 700° C. or more and 950° C. or less.

(Supplementary Description 8)

There is provided the method of the supplementary description 1, wherein a temperature of the substrate in forming the oxynitride film having the specific film thickness, is set to 750° C. or more and 950° C. or less.

(Supplementary Description 9)

There is provided the method of the supplementary description 1, wherein a temperature of the substrate in forming the oxynitride film having the specific film thickness, is set to 800° C. or more and 950° C. or less.

(Supplementary Description 10)

There is provided the method of the supplementary description 1, wherein a source gas supply tube for supplying the source gas into the nozzle, is connected to the nozzle, and a supply tube for supplying the inert gas or the hydrogen-containing gas into the source gas supply tube, is connected to the source gas supply tube, the inert gas or the hydrogen-containing gas being supplied toward the substrate together with the source gas through the nozzle.

(Supplementary Description 11)

There is provided the method of the supplementary description 1, wherein the specific element contains at least one of the elements selected from the group consisting of a semiconductor element and a metal element.

(Supplementary Description 12)

There is provided the method of the supplementary description 1, wherein the specific element contains a semiconductor element.

(Supplementary Description 13)

There is provided the method of the supplementary description 1, wherein the specific element contains a metal element.

(Supplementary Description 14)

There is provided the method of the supplementary description 1, wherein the specific element contains silicon.

(Supplementary Description 15)

According to other aspect of the present invention, there is provided a method of processing a substrate, including:

forming an oxynitride film having a specific film thickness on a substrate by alternately repeating:

forming a specific element-containing layer on the substrate by supplying a source gas containing a specific element to the substrate heated in a processing vessel, under a condition that a thermal decomposition reaction of the source gas is caused;

changing the specific element-containing layer to a nitride layer by supplying a nitrogen-containing gas to the substrate heated in the processing vessel under a pressure of less than atmospheric pressure; and changing the nitride layer to an oxynitride layer by supplying an oxygen-containing gas to the substrate heated in the processing vessel under a pressure of less than atmospheric pressure;

interposing into the above sequences, purging of an inside of the processing vessel by supplying an inert gas into the processing vessel, wherein in forming the specific element-containing layer, the source gas is supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by supplying an inert gas or a hydrogen-containing gas to the substrate through the nozzle together with the source gas.

(Supplementary Description 16)

There is provided a substrate processing apparatus, including:

a processing vessel configured to house a substrate;

a heater configured to heat the substrate in the processing vessel;

a source gas supply system configured to supply a source gas containing a specific element into the processing vessel;

a nitrogen-containing gas supply system configured to supply a nitrogen-containing gas into the processing vessel;

an oxygen-containing gas supply system configured to supply an oxygen-containing gas into the processing vessel;

an inert gas or a hydrogen-containing gas supply system configured to supply an inert gas or a hydrogen-containing gas into the processing vessel;

a pressure adjustment part configured to adjust a pressure in the processing vessel; and a control part configured to control the heater, the source gas supply system, the nitrogen-containing gas supply system, the oxygen-containing gas supply system, the inert gas or hydrogen-containing gas supply system and the pressure adjustment part, so that processing of forming an oxynitride film having a specific film thickness on the substrate is performed by alternately repeating:

processing of forming a specific element-containing layer on the substrate by supplying the source gas to the substrate heated in the processing vessel, under a condition that a thermal decomposition reaction of the source gas is caused;

processing of changing the specific element-containing layer to a nitride layer by supplying the nitrogen-containing gas to the substrate heated in the processing vessel under a pressure of less than atmospheric pressure; and processing of changing the nitride layer to an oxynitride layer by supplying the oxygen-containing gas to the substrate heated in the processing vessel under a pressure of less than atmospheric pressure, processing of interposing into the above sequences, purging of an inside of the processing vessel by supplying the inert gas into the processing vessel, wherein in forming the specific element-containing layer, the source gas is supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by supplying the inert gas or the hydrogen-containing gas to the substrate through the nozzle together with the source gas.

(Supplementary Description 17)

According to further other aspect of the present invention, there is provided a program configured to make a computer execute a procedure of forming an oxynitride film having a specific film thickness on a substrate by alternately repeating:

a procedure of forming a specific element-containing layer on the substrate by supplying a source gas containing a specific element to the substrate heated in a processing vessel, under a condition that a thermal decomposition reaction of the source gas is caused;

a procedure of changing the specific element-containing layer to a nitride layer by supplying a nitrogen-containing gas to the substrate heated in the processing vessel under a pressure of less than atmospheric pressure;

a procedure of changing the nitride layer to an oxynitride layer by supplying an oxygen-containing gas to the substrate heated in the processing vessel under a pressure of less than atmospheric pressure, a procedure of interposing into the above sequences, purging of an inside of the processing vessel by supplying an inert gas into the processing vessel, wherein in the procedure of forming the specific element-containing layer, the source gas is supplied to the substrate through a nozzle provided at a lateral side of the substrate, and at this time, the source gas is sprayed in parallel to a surface of the substrate more strongly than a case of spraying the inert gas in parallel to the surface of the substrate in purging an inside of the processing vessel, by supplying the inert gas or a hydrogen-containing gas to the substrate through the nozzle together with the source gas.

(Supplementary Description 18)

According to further other aspect of the present invention, there is provided a computer readable recording medium recording a program configured to make a computer execute a procedure of forming an oxynitride film having a specific film thickness on a substrate by alternately repeating:

a procedure of forming a specific element-containing layer on the substrate by supplying a source gas containing a specific element to the substrate heated in a processing vessel, under a condition that a thermal decomposition reaction of the source gas is caused;

a procedure of changing the specific element-containing layer to a nitride layer by supplying a nitrogen-containing gas to the substrate heated in the processing vessel under a pressure of less than atmospheric pressure;

a procedure of changing the nitride layer to an oxynitride layer by supplying an oxygen-containing gas to the substrate heated in the processing vessel under a pressure of less than atmospheric pressure, a procedure of interposing into the above sequences, purging of an inside of the processing vessel by supplying an inert gas into the processing vessel, wherein in the procedure of forming the specific element-containing layer, the source gas is supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by supplying an inert gas or a hydrogen-containing gas to the substrate through the nozzle together with the source gas.

DESCRIPTION OF SIGNS AND NUMERALS

121 Controller (control part)
200 Wafer (substrate)
201 Processing chamber
202 Processing furnace
203 Reaction tube
207 Heater
231 Exhaust tube
244 APC valve (pressure adjustment part)

The invention claimed is:

1. A method of manufacturing a semiconductor device, comprising:

forming an oxynitride film having a specific film thickness on a substrate by alternately repeating:

forming a specific element-containing layer on the substrate by supplying a source gas containing a specific element to the substrate heated in a processing vessel, under a condition that a thermal decomposition reaction of the source gas is caused;
changing the specific element-containing layer to a nitride layer by supplying a nitrogen-containing gas to the substrate heated in the processing vessel under a pressure of less than atmospheric pressure; and
changing the nitride layer to an oxynitride layer by supplying an oxygen-containing gas to the substrate heated in the processing vessel under a pressure of less than atmospheric pressure,
interposing into the above sequences, purging of an inside of the processing vessel by supplying an inert gas into the processing vessel,
wherein in forming the specific element-containing layer, the source gas and an inert gas, or the source gas and a hydrogen-containing gas are supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by setting a flow rate of the inert gas or the hydrogen-containing gas to a flow rate larger than a flow rate of the inert gas supplied in purging the inside of the processing vessel.

2. The method of claim 1, wherein in changing the nitride layer to the oxynitride layer, the nitride layer is oxidized without saturating an oxidation reaction of the nitride layer by the oxygen-containing gas.

3. The method of claim 1, wherein the oxygen-containing gas includes a nitrogen oxide-based gas.

4. The method of claim 1, wherein the oxygen-containing gas includes at least one of the gases selected from the group consisting of a $N_2O$ gas, a NO gas, and a $NO_2$ gas.

5. The method of claim 1, wherein the oxygen-containing gas includes a $N_2O$ gas.

6. The method of claim 1, wherein a temperature of the substrate in forming the oxynitride film having the specific film thickness, is set to 350° C. or more and 950° C. or less.

7. The method of claim 1, wherein a temperature of the substrate in forming the oxynitride film having the specific film thickness, is set to 700° C. or more and 950° C. or less.

8. The method of claim 1, wherein a temperature of the substrate in forming the oxynitride film having the specific film thickness, is set to 750° C. or more and 950° C. or less.

9. The method of claim 1, wherein a temperature of the substrate in forming the oxynitride film having the specific film thickness, is set to 800° C. or more and 950° C. or less.

10. The method of claim 1, wherein a source gas supply tube for supplying the source gas into the nozzle, is connected to the nozzle, and a supply tube for supplying the inert gas or the hydrogen-containing gas into the source gas supply tube, is connected to the source gas supply tube, the inert gas or the hydrogen-containing gas being supplied to the substrate together with the source gas through the nozzle.

11. The method of claim 1, wherein in forming the specific element-containing layer, the source gas is sprayed in parallel to the surface of the substrate more strongly than a case of spraying the inert gas in parallel to the surface of the substrate in purging the inside of the processing vessel, and more strongly than a case of spraying the nitrogen-containing gas in parallel to the surface of the substrate in changing the specific element-containing layer to the nitride layer.

12. The method of claim 1, wherein in forming the specific element-containing layer, the source gas is sprayed in parallel to the surface of the substrate more strongly than a case of spraying the inert gas in parallel to the surface of the substrate in purging the inside of the processing vessel, more strongly than a case of spraying the nitrogen-containing gas in parallel to the surface of the substrate in changing the specific element-containing layer to the nitride layer, and more strongly than a case of spraying the oxygen-containing gas in parallel to the surface of the substrate in changing the niride layer to the oxynitride layer.

13. The method of claim 1, wherein in forming the specific element-containing layer, the specific element-containing layer is formed while inhibiting deposition or adsorption of the specific element-containing layer onto the substrate by spraying the source gas in parallel to the surface of the substrate more strongly than a case of spraying the inert gas in parallel to the surface of the substrate in purging the inside of the processing vessel.

14. The method of claim 1, wherein in forming the specific element-containing layer, the specific element-containing layer is formed while inhibiting deposition or adsorption of the specific element-containing layer onto the substrate by spraying the source gas in parallel to the surface of the substrate more strongly than a case of spraying the inert gas in parallel to the surface of the substrate in purging the inside of the processing vessel, and at this time, a deposition center or an adsorption center of the specific element-containing layer is moved so as to be close to a center from an edge side of the substrate.

15. The method of claim 1, wherein the oxynitride film is formed as a gate insulating film.

16. The method of claim 15, further comprising forming a gate electrode on the oxynitride film.

17. The method of claim 1, wherein the oxynitride film is formed as a gate insulating film of a MOS capacitor.

18. A method of processing a substrate, comprising:
forming an oxynitride film having a specific film thickness on a substrate by alternately repeating:
forming a specific element-containing layer on the substrate by supplying a source gas containing a specific element to the substrate heated in a processing vessel, under a condition that a thermal decomposition reaction of the source gas is caused;
changing the specific element-containing layer to a nitride layer by supplying a nitrogen-containing gas to the substrate heated in the processing vessel under a pressure of less than atmospheric pressure; and
changing the nitride layer to an oxynitride layer by supplying an oxygen-containing gas to the substrate heated in the processing vessel under a pressure of less than atmospheric pressure;
interposing into the above sequences, purging of an inside of the processing vessel by supplying an inert gas into the processing vessel,
wherein in forming the specific element-containing layer, the source gas and an inert gas, or the source gas and a hydrogen-containing gas are supplied to the substrate through a nozzle provided at a lateral side of the substrate, and at this time, the source gas is sprayed in parallel to a surface of the substrate more strongly than a case of spraying the inert gas in parallel to the surface of the substrate in purging the inside of the processing vessel, by setting a flow rate of the inert gas or the hydrogen-containing gas to a flow rate larger than a flow rate of the inert gas supplied in purging the inside of the processing vessel.

19. A non-transitory computer-readable recording medium storing a program that causes a computer to perform a procedure of forming an oxynitride film having a specific film thickness on a substrate by alternately repeating:
- a procedure of forming a specific element-containing layer on the substrate by supplying a source gas containing a specific element to the substrate heated in a processing vessel, under a condition that a thermal decomposition reaction of the source gas is caused;
- a procedure of changing the specific element-containing layer to a nitride layer by supplying a nitrogen-containing gas to the substrate heated in the processing vessel under a pressure of less than atmospheric pressure; and
- a procedure of changing the nitride layer to an oxynitride layer by supplying an oxygen-containing gas to the substrate heated in the processing vessel under a pressure of less than atmospheric pressure,
- interposing into the above sequences, a procedure of purging an inside of the processing vessel by supplying an inert gas into the processing vessel,
- wherein in the procedure of forming the specific element-containing layer, the source gas and an inert gas, or a the source gas and a hydrogen-containing gas are supplied to the substrate through a nozzle provided at a lateral side of the substrate, and at this time, the source gas is sprayed in parallel to a surface of the substrate more strongly than a case of spraying the inert gas in parallel to the surface of the substrate in the procedure of purging the inside of the processing vessel, by setting a flow rate of the inert gas or the hydrogen-containing gas to a flow rate larger than a flow rate of the inert gas supplied in the procedure of purging the inside of the processing vessel.

* * * * *